(12) United States Patent
Olson

(10) Patent No.: US 9,590,674 B2
(45) Date of Patent: Mar. 7, 2017

(54) SEMICONDUCTOR DEVICES WITH SWITCHABLE GROUND-BODY CONNECTION

(71) Applicant: PEREGRINE SEMICONDUCTOR CORPORATION, San Diego, CA (US)

(72) Inventor: Chris Olson, Chicago, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 267 days.

(21) Appl. No.: 13/715,805

(22) Filed: Dec. 14, 2012

(65) Prior Publication Data

US 2014/0171010 A1 Jun. 19, 2014

(51) Int. Cl.
*H04B 1/16* (2006.01)
*H01L 29/78* (2006.01)
*H01L 27/088* (2006.01)
*H01L 27/092* (2006.01)

(52) U.S. Cl.
CPC ............. *H04B 1/16* (2013.01); *H01L 27/088* (2013.01); *H01L 27/092* (2013.01); *H01L 29/7841* (2013.01)

(58) Field of Classification Search
CPC combination set(s) only.
See application file for complete search history.

(56) References Cited

U.S. PATENT DOCUMENTS

| | | |
|---|---|---|
| 3,646,361 A | 2/1972 | Pfiffner |
| 3,699,359 A | 10/1972 | Shelby |
| 3,975,671 A | 8/1976 | Stoll |
| 3,983,414 A | 9/1976 | Stafford et al. |
| 3,988,727 A | 10/1976 | Scott |
| 4,053,916 A | 10/1977 | Cricchi et al. |
| 4,145,719 A | 3/1979 | Hand et al. |
| 4,244,000 A | 1/1981 | Ueda et al. |
| 4,256,977 A | 3/1981 | Hendrickson |
| 4,316,101 A | 2/1982 | Minner |
| 4,317,055 A | 2/1982 | Yoshida et al. |
| 4,367,421 A | 1/1983 | Baker |
| 4,390,798 A | 6/1983 | Kurafuji |
| RE31,749 E | 11/1984 | Yamashiro |
| 4,638,184 A | 1/1987 | Kimura |
| 4,736,169 A | 4/1988 | Weaver et al. |
| 4,739,191 A | 4/1988 | Puar |

(Continued)

FOREIGN PATENT DOCUMENTS

| | | |
|---|---|---|
| CN | 1256521 A | 6/2000 |
| DE | 19832565 | 8/1999 |

(Continued)

OTHER PUBLICATIONS

Omura, Yasuhisa, et al., "Simplified Analysis of Body-Contact Effect for MOSFET/SOI", IEEE Transactions on Electron Devices, vol. 35, No. 8, Aug. 1988, pp. 1391-1393.

(Continued)

*Primary Examiner* — Junpeng Chen
(74) *Attorney, Agent, or Firm* — Jaquez Land Greenhaus LLP; Martin J. Jaquez, Esq.; Alessandro Steinfl, Esq.

(57) ABSTRACT

Semiconductor devices with switchable connection between body and a ground node are presented. Methods for operating and fabricating such semiconductor devices are also presented.

35 Claims, 8 Drawing Sheets

(56) References Cited

U.S. PATENT DOCUMENTS

| | | |
|---|---|---|
| 4,746,960 A | 5/1988 | Valeri et al. |
| 4,748,485 A | 5/1988 | Vasudev |
| 4,809,056 A | 2/1989 | Shirato et al. |
| 4,810,911 A | 3/1989 | Noguchi |
| 4,825,145 A | 4/1989 | Tanaka et al. |
| 4,849,651 A | 7/1989 | Estes, Jr. |
| 4,890,077 A | 12/1989 | Sun |
| 4,891,609 A | 1/1990 | Eilley |
| 4,906,587 A | 3/1990 | Blake |
| 4,929,855 A | 5/1990 | Ezzeddine |
| 4,939,485 A | 7/1990 | Eisenberg |
| 4,984,040 A | 1/1991 | Yap |
| 4,985,647 A | 1/1991 | Kawada |
| 4,999,585 A | 3/1991 | Burt et al. |
| 5,001,528 A | 3/1991 | Bahraman |
| 5,012,123 A | 4/1991 | Ayasli et al. |
| 5,023,494 A | 6/1991 | Tsukii et al. |
| 5,061,907 A | 10/1991 | Rasmussen |
| 5,061,911 A | 10/1991 | Weidman et al. |
| 5,081,706 A | 1/1992 | Kim |
| 5,095,348 A | 3/1992 | Houston |
| 5,107,152 A | 4/1992 | Jain et al. |
| 5,124,762 A | 6/1992 | Childs et al. |
| 5,125,007 A | 6/1992 | Yamaguchi et al. |
| 5,146,178 A | 9/1992 | Nojima et al. |
| 5,148,393 A | 9/1992 | Furuyama |
| 5,157,279 A | 10/1992 | Lee |
| 5,182,529 A | 1/1993 | Chern |
| 5,208,557 A | 5/1993 | Kersh, III |
| 5,272,457 A | 12/1993 | Heckaman et al. |
| 5,274,343 A | 12/1993 | Russell et al. |
| 5,283,457 A | 2/1994 | Matloubian |
| 5,285,367 A | 2/1994 | Keller |
| 5,306,954 A | 4/1994 | Chan et al. |
| 5,313,083 A | 5/1994 | Schindler |
| 5,317,181 A | 5/1994 | Tyson |
| 5,319,604 A | 6/1994 | Imondi et al. |
| 5,345,422 A | 9/1994 | Redwine |
| 5,350,957 A | 9/1994 | Cooper et al. |
| 5,375,257 A | 12/1994 | Lampen |
| 5,405,795 A | 4/1995 | Beyer et al. |
| 5,416,043 A | 5/1995 | Burgener et al. |
| 5,422,590 A | 6/1995 | Coffman et al. |
| 5,442,327 A | 8/1995 | Longbrake et al. |
| 5,446,418 A | 8/1995 | Hara et al. |
| 5,448,207 A | 9/1995 | Kohama |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,548,239 A | 8/1996 | Kohama |
| 5,553,295 A | 9/1996 | Pantelakis et al. |
| 5,554,892 A | 9/1996 | Norimatsu |
| 5,559,368 A | 9/1996 | Hu et al. |
| 5,572,040 A | 11/1996 | Reedy et al. |
| 5,576,647 A | 11/1996 | Sutardja |
| 5,578,853 A | 11/1996 | Hayashi et al. |
| 5,581,106 A | 12/1996 | Hayashi et al. |
| 5,594,371 A | 1/1997 | Douseki |
| 5,596,205 A | 1/1997 | Reedy et al. |
| 5,597,739 A | 1/1997 | Sumi et al. |
| 5,600,169 A | 2/1997 | Burgener et al. |
| 5,600,588 A | 2/1997 | Kawashima |
| 5,610,533 A | 3/1997 | Arimoto et al. |
| 5,629,655 A | 5/1997 | Dent |
| 5,663,570 A | 9/1997 | Reedy et al. |
| 5,670,907 A | 9/1997 | Gorecki et al. |
| 5,681,761 A | 10/1997 | Kim |
| 5,689,144 A | 11/1997 | Williams |
| 5,694,308 A | 12/1997 | Cave |
| 5,699,018 A | 12/1997 | Yamamoto et al. |
| 5,717,356 A | 2/1998 | Kohama |
| 5,729,039 A | 3/1998 | Beyer et al. |
| 5,731,607 A | 3/1998 | Kohama |
| 5,734,291 A | 3/1998 | Tasdighi et al. |
| 5,748,016 A | 5/1998 | Kurosawa |
| 5,748,053 A | 5/1998 | Kameyama et al. |
| 5,753,955 A | 5/1998 | Fechner |
| 5,760,652 A | 6/1998 | Yamamoto et al. |
| 5,767,549 A | 6/1998 | Chen et al. |
| 5,774,411 A | 6/1998 | Hsieh et al. |
| 5,774,792 A | 6/1998 | Tanaka et al. |
| 5,777,530 A | 7/1998 | Nakatuka |
| 5,784,311 A | 7/1998 | Assaderaghi et al. |
| 5,784,687 A | 7/1998 | Itoh et al. |
| 5,793,246 A | 8/1998 | Vest et al. |
| 5,801,577 A | 9/1998 | Tailliet |
| 5,804,858 A | 9/1998 | Hsu et al. |
| 5,807,772 A | 9/1998 | Takemura |
| 5,808,505 A | 9/1998 | Tsukada |
| 5,812,939 A | 9/1998 | Kohama |
| 5,814,899 A | 9/1998 | Okumura et al. |
| 5,818,099 A | 10/1998 | Burghartz |
| 5,818,278 A | 10/1998 | Yamamoto et al. |
| 5,818,283 A | 10/1998 | Tonami et al. |
| 5,818,289 A | 10/1998 | Chevallier et al. |
| 5,818,766 A | 10/1998 | Song |
| 5,821,769 A | 10/1998 | Douseki |
| 5,821,800 A | 10/1998 | Le et al. |
| 5,825,227 A | 10/1998 | Kohama et al. |
| 5,861,336 A | 1/1999 | Reedy et al. |
| 5,863,823 A | 1/1999 | Burgener |
| 5,864,328 A | 1/1999 | Kajimoto |
| 5,874,836 A | 2/1999 | Nowak et al. |
| 5,874,849 A | 2/1999 | Marotta et al. |
| 5,877,978 A | 3/1999 | Morishita et al. |
| 5,878,331 A | 3/1999 | Yamamoto et al. |
| 5,880,620 A | 3/1999 | Gitlin et al. |
| 5,883,396 A | 3/1999 | Reedy et al. |
| 5,883,541 A | 3/1999 | Tahara et al. |
| 5,892,260 A | 4/1999 | Okumura et al. |
| 5,892,382 A | 4/1999 | Ueda et al. |
| 5,892,400 A | 4/1999 | van Saders et al. |
| 5,895,957 A | 4/1999 | Reedy et al. |
| 5,903,178 A | 5/1999 | Miyatsuji et al. |
| 5,912,560 A | 6/1999 | Pasternak |
| 5,917,362 A | 6/1999 | Kohama |
| 5,920,093 A | 7/1999 | Huang et al. |
| 5,920,233 A | 7/1999 | Denny |
| 5,926,466 A | 7/1999 | Ishida et al. |
| 5,930,605 A | 7/1999 | Mistry et al. |
| 5,930,638 A | 7/1999 | Reedy et al. |
| 5,945,867 A | 8/1999 | Uda et al. |
| 5,959,335 A | 9/1999 | Bryant et al. |
| 5,969,560 A | 10/1999 | Kohama et al. |
| 5,973,363 A | 10/1999 | Staab et al. |
| 5,973,364 A | 10/1999 | Kawanaka |
| 5,973,382 A | 10/1999 | Burgener et al. |
| 5,973,636 A | 10/1999 | Okubo et al. |
| 5,986,518 A | 11/1999 | Dougherty |
| 5,990,580 A | 11/1999 | Weigand |
| 6,020,778 A | 2/2000 | Shigehara |
| 6,020,781 A | 2/2000 | Fujioka |
| 6,049,110 A | 4/2000 | Koh |
| 6,057,555 A | 5/2000 | Reedy et al. |
| 6,057,723 A | 5/2000 | Yamaji et al. |
| 6,061,267 A | 5/2000 | Houston |
| 6,064,275 A | 5/2000 | Yamauchi |
| 6,064,872 A | 5/2000 | Vice |
| 6,066,993 A | 5/2000 | Yamamoto et al. |
| 6,081,165 A | 6/2000 | Goldman |
| 6,081,443 A | 6/2000 | Morishita et al. |
| 6,081,694 A | 6/2000 | Matsuura et al. |
| 6,084,255 A | 7/2000 | Ueda et al. |
| 6,087,893 A | 7/2000 | Oowaki et al. |
| 6,094,088 A | 7/2000 | Yano |
| 6,100,564 A | 8/2000 | Bryant et al. |
| 6,104,061 A | 8/2000 | Forbes et al. |
| 6,111,778 A | 8/2000 | MacDonald et al. |
| 6,114,923 A | 9/2000 | Mizutani |
| 6,118,343 A | 9/2000 | Winslow |
| 6,122,185 A | 9/2000 | Utsunomiya et al. |
| 6,130,570 A | 10/2000 | Pan et al. |
| 6,133,752 A | 10/2000 | Kawagoe |

(56) References Cited

U.S. PATENT DOCUMENTS

| | | |
|---|---|---|
| 6,160,292 A | 12/2000 | Flaker et al. |
| 6,169,444 B1 | 1/2001 | Thurber, Jr. |
| 6,172,378 B1 | 1/2001 | Hull et al. |
| 6,173,235 B1 | 1/2001 | Maeda |
| 6,177,826 B1 | 1/2001 | Mashiko et al. |
| 6,188,247 B1 | 2/2001 | Storino et al. |
| 6,188,590 B1 | 2/2001 | Chang et al. |
| 6,191,449 B1 | 2/2001 | Shino |
| 6,195,307 B1 | 2/2001 | Umezawa et al. |
| 6,201,761 B1 | 3/2001 | Wollesen |
| RE37,124 E | 4/2001 | Monk et al. |
| 6,215,360 B1 | 4/2001 | Callaway, Jr. |
| 6,218,248 B1 | 4/2001 | Hwang et al. |
| 6,218,890 B1 | 4/2001 | Yamaguchi et al. |
| 6,218,892 B1 | 4/2001 | Soumyanath et al. |
| 6,222,394 B1 | 4/2001 | Allen et al. |
| 6,239,649 B1 | 5/2001 | Bertin et al. |
| 6,249,027 B1 | 6/2001 | Burr |
| 6,249,029 B1 | 6/2001 | Bryant et al. |
| 6,249,446 B1 | 6/2001 | Shearon et al. |
| 6,281,737 B1 | 8/2001 | Kuang et al. |
| 6,288,458 B1 | 9/2001 | Berndt |
| 6,297,687 B1 | 10/2001 | Sugimura |
| 6,300,796 B1 | 10/2001 | Troutman et al. |
| 6,304,110 B1 | 10/2001 | Hirano |
| 6,308,047 B1 | 10/2001 | Yamamoto et al. |
| 6,310,508 B1 | 10/2001 | Westerman |
| 6,316,983 B1 | 11/2001 | Kitamura |
| 6,320,225 B1 | 11/2001 | Hargrove et al. |
| 6,337,594 B1 | 1/2002 | Hwang |
| 6,341,087 B1 | 1/2002 | Kunikiyo |
| 6,355,957 B1 | 3/2002 | Maeda et al. |
| 6,356,536 B1 | 3/2002 | Repke |
| 6,365,488 B1 | 4/2002 | Liao |
| 6,380,793 B1 | 4/2002 | Bancal et al. |
| 6,380,796 B2 | 4/2002 | Sakai et al. |
| 6,387,739 B1 | 5/2002 | Smith |
| 6,392,440 B2 | 5/2002 | Nebel |
| 6,392,467 B1 | 5/2002 | Oowaki et al. |
| 6,396,325 B2 | 5/2002 | Goodell |
| 6,400,211 B1 | 6/2002 | Yokomizo et al. |
| 6,407,427 B1 | 6/2002 | Oh |
| 6,407,614 B1 | 6/2002 | Takahashi |
| 6,411,156 B1 | 6/2002 | Borkar et al. |
| 6,414,353 B2 | 7/2002 | Maeda et al. |
| 6,414,863 B1 | 7/2002 | Bayer et al. |
| 6,429,487 B1 | 8/2002 | Kunikiyo |
| 6,429,632 B1 | 8/2002 | Forbes et al. |
| 6,429,723 B1 | 8/2002 | Hastings |
| 6,433,587 B1 | 8/2002 | Assaderaghi et al. |
| 6,433,589 B1 | 8/2002 | Lee |
| 6,452,232 B1 | 9/2002 | Adan |
| 6,461,902 B1 | 10/2002 | Xu et al. |
| 6,466,082 B1 * | 10/2002 | Krishnan ............ H01L 27/1203 257/347 |
| 6,469,568 B2 | 10/2002 | Toyoyama et al. |
| 6,486,511 B1 | 11/2002 | Nathanson et al. |
| 6,486,729 B2 | 11/2002 | Imamiya |
| 6,498,058 B1 | 12/2002 | Bryant et al. |
| 6,498,370 B1 | 12/2002 | Kim et al. |
| 6,504,212 B1 | 1/2003 | Allen et al. |
| 6,504,213 B1 | 1/2003 | Ebina |
| 6,512,269 B1 | 1/2003 | Bryant et al. |
| 6,518,645 B2 | 2/2003 | Bae et al. |
| 6,521,959 B2 | 2/2003 | Kim et al. |
| 6,537,861 B1 | 3/2003 | Kroell et al. |
| 6,559,689 B1 | 5/2003 | Clark |
| 6,563,366 B1 | 5/2003 | Kohama |
| 6,573,533 B1 | 6/2003 | Yamazaki |
| 6,608,785 B2 | 8/2003 | Chuang et al. |
| 6,608,789 B2 | 8/2003 | Sullivan et al. |
| 6,617,933 B2 | 9/2003 | Ito et al. |
| 6,631,505 B2 | 10/2003 | Arai |
| 6,632,724 B2 | 10/2003 | Henley et al. |
| 6,642,578 B1 | 11/2003 | Arnold et al. |
| 6,646,305 B2 | 11/2003 | Assaderaghi et al. |
| 6,653,697 B2 | 11/2003 | Hidaka et al. |
| 6,670,655 B2 | 12/2003 | Lukes et al. |
| 6,677,641 B2 | 1/2004 | Kocon |
| 6,677,803 B1 | 1/2004 | Chiba |
| 6,684,065 B2 | 1/2004 | Bult |
| 6,693,326 B2 | 2/2004 | Adan |
| 6,693,498 B1 | 2/2004 | Sasabata et al. |
| 6,698,082 B2 | 3/2004 | Crenshaw et al. |
| 6,703,863 B2 | 3/2004 | Gion |
| 6,704,550 B1 | 3/2004 | Kohama et al. |
| 6,711,397 B1 | 3/2004 | Petrov et al. |
| 6,714,065 B2 | 3/2004 | Komiya et al. |
| 6,717,458 B1 | 4/2004 | Potanin |
| 6,762,477 B2 | 7/2004 | Kunikiyo |
| 6,774,701 B1 | 8/2004 | Heston et al. |
| 6,781,805 B1 | 8/2004 | Urakawa |
| 6,788,130 B2 | 9/2004 | Pauletti et al. |
| 6,790,747 B2 | 9/2004 | Henley et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,016 B2 | 11/2004 | Sander et al. |
| 6,819,938 B2 | 11/2004 | Sahota |
| 6,830,963 B1 | 12/2004 | Forbes |
| 6,836,172 B2 | 12/2004 | Okashita |
| 6,870,241 B2 | 3/2005 | Nakatani et al. |
| 6,871,059 B1 | 3/2005 | Piro et al. |
| 6,879,502 B2 | 4/2005 | Yoshida et al. |
| 6,882,210 B2 | 4/2005 | Asano et al. |
| 6,891,234 B1 | 5/2005 | Connelly et al. |
| 6,897,701 B2 | 5/2005 | Chen et al. |
| 6,898,778 B2 | 5/2005 | Kawanaka |
| 6,903,596 B2 | 6/2005 | Geller et al. |
| 6,908,832 B2 | 6/2005 | Farrens et al. |
| 6,917,258 B2 | 7/2005 | Kushitani et al. |
| 6,933,744 B2 | 8/2005 | Das et al. |
| 6,947,720 B2 | 9/2005 | Razavi et al. |
| 6,969,668 B1 | 11/2005 | Kang et al. |
| 6,975,271 B2 | 12/2005 | Adachi et al. |
| 6,978,122 B2 | 12/2005 | Kawakyu et al. |
| 6,978,437 B1 | 12/2005 | Rittman et al. |
| 7,023,260 B2 | 4/2006 | Thorp et al. |
| 7,042,245 B2 | 5/2006 | Hidaka |
| 7,045,873 B2 | 5/2006 | Chen et al. |
| 7,056,808 B2 | 6/2006 | Henley et al. |
| 7,057,472 B2 | 6/2006 | Fukamachi et al. |
| 7,058,922 B2 | 6/2006 | Kawanaka |
| 7,082,293 B1 | 7/2006 | Rofougaran et al. |
| 7,092,677 B1 | 8/2006 | Zhang et al. |
| 7,109,532 B1 | 9/2006 | Lee et al. |
| 7,123,898 B2 | 10/2006 | Burgener et al. |
| 7,129,545 B2 | 10/2006 | Cain |
| 7,132,873 B2 | 11/2006 | Hollmer |
| 7,138,846 B2 | 11/2006 | Suwa et al. |
| 7,161,197 B2 | 1/2007 | Nakatsuka et al. |
| 7,173,471 B2 | 2/2007 | Nakatsuka et al. |
| 7,199,635 B2 | 4/2007 | Nakatsuka et al. |
| 7,202,734 B1 | 4/2007 | Raab |
| 7,212,788 B2 | 5/2007 | Weber et al. |
| 7,266,014 B2 | 9/2007 | Wu et al. |
| 7,269,392 B2 | 9/2007 | Nakajima et al. |
| 7,307,490 B2 | 12/2007 | Kizuki |
| 7,345,342 B2 | 3/2008 | Challa |
| 7,345,521 B2 | 3/2008 | Takahashi et al. |
| 7,355,455 B2 | 4/2008 | Hidaka |
| 7,391,282 B2 | 6/2008 | Nakatsuka et al. |
| 7,404,157 B2 | 7/2008 | Tanabe |
| 7,405,982 B1 | 7/2008 | Flaker et al. |
| 7,432,552 B2 | 10/2008 | Park |
| 7,460,852 B2 | 12/2008 | Burgener et al. |
| 7,515,882 B2 | 4/2009 | Kelcourse et al. |
| 7,561,853 B2 | 7/2009 | Miyazawa |
| 7,616,482 B2 | 11/2009 | Prall |
| 7,659,152 B2 | 2/2010 | Gonzalez et al. |
| 7,710,189 B2 | 5/2010 | Toda |
| 7,733,156 B2 | 6/2010 | Brederlow et al. |
| 7,733,157 B2 | 6/2010 | Brederlow et al. |
| 7,741,869 B2 | 6/2010 | Hidaka |

(56) References Cited

U.S. PATENT DOCUMENTS

| | | |
|---|---|---|
| 7,796,969 B2 | 9/2010 | Kelly et al. |
| 7,860,499 B2 | 12/2010 | Burgener et al. |
| 7,890,891 B2 | 2/2011 | Stuber et al. |
| 7,910,993 B2 | 3/2011 | Brindle et al. |
| 7,928,759 B2 | 4/2011 | Hidaka |
| 7,982,265 B2 | 7/2011 | Challa et al. |
| 8,081,928 B2 | 12/2011 | Kelly |
| 8,129,787 B2 | 3/2012 | Brindle et al. |
| 8,405,147 B2 | 3/2013 | Brindle et al. |
| 8,527,949 B1 | 9/2013 | Pleis et al. |
| 8,583,111 B2 | 11/2013 | Burgener et al. |
| 8,669,804 B2 | 3/2014 | Ranta et al. |
| 8,742,502 B2 | 6/2014 | Brindle et al. |
| 8,954,902 B2 | 2/2015 | Stuber et al. |
| 9,087,899 B2 | 7/2015 | Brindle et al. |
| 9,130,564 B2 | 9/2015 | Brindle et al. |
| 9,225,378 B2 | 12/2015 | Burgener et al. |
| 9,397,656 B2 | 7/2016 | Dribinsky et al. |
| 2001/0015461 A1 | 8/2001 | Ebina |
| 2001/0031518 A1 | 10/2001 | Kim et al. |
| 2001/0040479 A1 | 11/2001 | Zhang |
| 2001/0045602 A1 | 11/2001 | Maeda et al. |
| 2002/0029971 A1 | 3/2002 | Kovacs |
| 2002/0115244 A1 | 8/2002 | Park et al. |
| 2002/0126767 A1 | 9/2002 | Ding et al. |
| 2002/0195623 A1 | 12/2002 | Horiuchi |
| 2003/0002452 A1 | 1/2003 | Sahota |
| 2003/0141543 A1 | 7/2003 | Bryant et al. |
| 2003/0160515 A1 | 8/2003 | Yu et al. |
| 2003/0181167 A1 | 9/2003 | Iida |
| 2003/0201494 A1 | 10/2003 | Maeda et al. |
| 2003/0205760 A1 | 11/2003 | Kawanaka et al. |
| 2003/0222313 A1 | 12/2003 | Fechner |
| 2003/0227056 A1 | 12/2003 | Wang et al. |
| 2004/0021137 A1 | 2/2004 | Fazan et al. |
| 2004/0021501 A1* | 2/2004 | Das .................... H03K 19/0016 327/534 |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2004/0217372 A1* | 11/2004 | Chen ................. H01L 21/82389 257/107 |
| 2004/0227565 A1 | 11/2004 | Chen et al. |
| 2004/0242182 A1 | 12/2004 | Hidaka et al. |
| 2005/0017789 A1 | 1/2005 | Burgener et al. |
| 2005/0077564 A1 | 4/2005 | Forbes |
| 2005/0079829 A1 | 4/2005 | Ogawa et al. |
| 2005/0121699 A1 | 6/2005 | Chen et al. |
| 2005/0127442 A1 | 6/2005 | Veeraraghavan |
| 2005/0167751 A1 | 8/2005 | Nakajima et al. |
| 2005/0212595 A1 | 9/2005 | Kusunoki et al. |
| 2005/0264341 A1 | 12/2005 | Hikita et al. |
| 2006/0009164 A1* | 1/2006 | Kataoka ......................... 455/83 |
| 2006/0022526 A1 | 2/2006 | Cartalade |
| 2006/0194558 A1 | 8/2006 | Kelly |
| 2006/0194567 A1 | 8/2006 | Kelly et al. |
| 2006/0267093 A1 | 11/2006 | Tang et al. |
| 2007/0018247 A1 | 1/2007 | Brindle et al. |
| 2007/0023833 A1 | 2/2007 | Okhonin et al. |
| 2007/0045697 A1 | 3/2007 | Cheng et al. |
| 2007/0069291 A1 | 3/2007 | Stuber et al. |
| 2007/0120103 A1 | 5/2007 | Burgener et al. |
| 2007/0176233 A1* | 8/2007 | Ozawa ................ H01L 27/1203 257/335 |
| 2007/0279120 A1 | 12/2007 | Brederlow et al. |
| 2007/0290744 A1 | 12/2007 | Adachi et al. |
| 2008/0073719 A1 | 3/2008 | Fazan et al. |
| 2008/0076371 A1 | 3/2008 | Dribinsky et al. |
| 2008/0079653 A1* | 4/2008 | Ahn .................... H03K 17/063 343/904 |
| 2008/0191788 A1 | 8/2008 | Chen et al. |
| 2008/0303080 A1 | 12/2008 | Bhattacharyya |
| 2009/0029511 A1 | 1/2009 | Wu |
| 2009/0117871 A1 | 5/2009 | Burgener et al. |
| 2011/0163779 A1 | 7/2011 | Hidaka |
| 2011/0169550 A1 | 7/2011 | Brindle et al. |
| 2011/0227637 A1 | 9/2011 | Stuber et al. |
| 2012/0169398 A1 | 7/2012 | Brindle et al. |
| 2012/0194276 A1* | 8/2012 | Fisher .......................... 330/296 |
| 2012/0267719 A1 | 10/2012 | Brindle et al. |
| 2013/0293280 A1 | 11/2013 | Brindle et al. |
| 2014/0167834 A1 | 6/2014 | Stuber et al. |
| 2014/0179374 A1 | 6/2014 | Burgener et al. |
| 2015/0015321 A1 | 1/2015 | Dribinsky et al. |
| 2016/0064561 A1 | 3/2016 | Brindle et al. |

FOREIGN PATENT DOCUMENTS

| | | |
|---|---|---|
| EP | 385641 | 9/1990 |
| EP | 0622901 | 11/1994 |
| EP | 782267 | 7/1997 |
| EP | 0788185 | 8/1997 |
| EP | 0851561 | 1/1998 |
| EP | 913939 | 5/1999 |
| EP | 625831 | 11/1999 |
| EP | 1006584 | 6/2000 |
| EP | 1925030 | 5/2008 |
| EP | 2348532 A2 | 7/2011 |
| EP | 2348533 A2 | 7/2011 |
| EP | 2348534 A2 | 7/2011 |
| EP | 2348535 A2 | 7/2011 |
| EP | 2348536 A2 | 7/2011 |
| EP | 2387094 | 11/2011 |
| EP | 2387094 | 5/2016 |
| EP | 3113280 | 1/2017 |
| JP | 55-75348 | 6/1980 |
| JP | 1254014 | 10/1989 |
| JP | 02-161769 | 6/1990 |
| JP | 04-34980 | 2/1992 |
| JP | 4183008 | 6/1992 |
| JP | 5299995 | 11/1993 |
| JP | 6112795 | 4/1994 |
| JP | 06-314985 | 11/1994 |
| JP | A-06-334506 | 12/1994 |
| JP | 7046109 | 2/1995 |
| JP | 07-070245 | 3/1995 |
| JP | 07106937 | 4/1995 |
| JP | 8023270 | 1/1996 |
| JP | 8070245 | 3/1996 |
| JP | 8148949 | 6/1996 |
| JP | 11163704 | 6/1996 |
| JP | 8251012 | 9/1996 |
| JP | A-08-307305 | 11/1996 |
| JP | 8330930 | 12/1996 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 09163721 | 6/1997 |
| JP | 9163721 | 6/1997 |
| JP | 09-200021 | 7/1997 |
| JP | 9181641 | 7/1997 |
| JP | 9186501 | 7/1997 |
| JP | 9200074 | 7/1997 |
| JP | 9238059 | 9/1997 |
| JP | 9243738 | 9/1997 |
| JP | 09-008621 | 10/1997 |
| JP | 09-284114 | 10/1997 |
| JP | 9270659 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10242826 | 9/1998 |
| JP | A-10-242829 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-136111 | 5/1999 |

(56) References Cited

FOREIGN PATENT DOCUMENTS

| | | |
|---|---|---|
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2001089448 | 3/2001 |
| JP | 2001-119281 | 4/2001 |
| JP | 2001157487 | 5/2001 |
| JP | 2001156182 | 6/2001 |
| JP | 2001274265 | 10/2001 |
| JP | 2004515937 | 5/2002 |
| JP | 2000358775 | 6/2002 |
| JP | 2003060451 | 2/2003 |
| JP | 2003101407 | 4/2003 |
| JP | 2003143004 | 5/2003 |
| JP | 2003167615 | 6/2003 |
| JP | 2003189248 | 7/2003 |
| JP | 2003332583 | 11/2003 |
| JP | 2003-347553 | 12/2003 |
| JP | 2002156602 | 12/2003 |
| JP | 2004-147175 | 5/2004 |
| JP | 2004166470 | 6/2004 |
| JP | 2004199950 | 7/2004 |
| JP | 2004288978 | 10/2004 |
| JP | 2005-251931 | 9/2005 |
| JP | 5678106 | 1/2015 |
| KR | 1994027615 | 12/1994 |
| WO | WO86/01037 | 2/1986 |
| WO | WO9523460 | 8/1995 |
| WO | WO9806174 | 2/1998 |
| WO | WO9935695 | 7/1999 |
| WO | WO0227920 | 4/2002 |
| WO | WO03032431 | 4/2003 |
| WO | WO2007/008934 A1 | 1/2007 |
| WO | WO2007/035610 A2 | 3/2007 |
| WO | WO2007033045 A2 | 3/2007 |
| WO | WO2012054642 | 4/2012 |

OTHER PUBLICATIONS

Numata, et al., "A +2.4/0 V Controlled High Power GaAs SPDT Antenna Switch IC for GSM Application", IEEE Radio Frequency Integrated Circuits Symposium, 2002, pp. 141-144.

Tinella, et al., "A 0.7dB Insertion Loss CMOS—SOI Antenna Switch with More than 50dB Isolation over the 2.5 to 5GHz Band", Proceeding of the 28th European Solid-State Circuits Conference, 2002, pp. 483-486.

Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.

Nakayama, et al., "A 1.9 GHz Single-Chip RF Front-End GaAs MMIC with Low-Distortion Cascade FET Mixer for Personal Handy-Phone System Terminals", IEEE, 1998, pp. 101-104.

McGrath, et al., "A 1.9-GHz GaAs Chip Set for the Personal Handyphone System", IEEE Transaction on Microwave Theory and Techniques, 1995, pp. 1733-1744.

Nakayama, et al., "A 1.9GHz Single-Chip RF Front End GaAs MMIC for Personal Communications", Microwave and Millimeter-Wave Monolithic Circuits Symposium, 1996, pp. 69-72.

Nakayama, et al., "A 1.9GHz Single-Chip RF Front End GaAs MMIC with Low-Distortion Cascode FET Mixer for Personal Handy-Phone System Terminals", Radio Frequency Integrated Circuits Symposium, 1998, pp. 205-208.

Gu, et al., "A 2.3V PHEMT Power SP3T Antenna Switch IC for GSM Handsets", IEEE GaAs Digest, 2003, pp. 48-51.

Darabi, et al., "A 2.4GHz CMOS Transceiver for Bluetooth", IEEE, 2001, pp. 89-92.

Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.

Huang, et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.

Yamamoto, et al., "A 2.4GHz Band 1.8V Operation Single Chip Si-CMOS T/R MMIC Front End with a Low Insertion Loss Switch", IEEE Journal of Solid-State Circuits, vol. 36, No. 8, Aug. 2001, pp. 1186-1197.

Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.

Huang, et al., "A 900-MHz T/R Switch with a 0.8-dB Insertion Loss Implemented in a 0.5-um CMOS Process", IEEE Custom Integrated Circuits Conference, 2000, pp. 341-344.

Valeri, et al., "A Composite High Voltage Device Using Low Voltage SOI MOSFEt's", IEEE, 1990, pp. 169-170.

Miyatsuji, et al., "A GaAs High Power RF Single Pole Double Throw Switch IC for Digital Mobile Communication System", IEEE International Solid-State Circuits Conference, 1994, pp. 34-35.

Miyatsuji, et al., "A GaAs High Power RF Single Pole Dual Throw Switch IC for Digital Mobile Communication System", IEEE Journal of Solid-State Circuits, 1995, pp. 979-983.

Puechberty, et al., "A GaAs Power Chip Set for 3V Cellular Communications", 1994.

Yamamoto, et al., "A GaAs RF Transceiver IC for 1.9GHz Digital Mobile Communication Systems", ISSCC96, 1996, pp. 340-341, 469.

Choumei, et al., "A High Efficiency, 2V Single Supply Voltage Operation RF Front End MMIC for 1.9GHz Personal Handy Phone Systems", IEEE, 1998, pp. 73-76.

Schindler, et al., "A High Power 2-18 GHz T/R Switch", IEEE Microwave and Millimeter-Wave Monolithic Circuits Symposium, 1990, pp. 119-122.

Gu, et al., "A High Power DPDT MMIC Switch for Broadband Wireless Applications", IEEE MTT-s Digest, 2003, pp. 173-176.

Gu, et al., "A High Performance GaAs SP3T Switch for Digital Cellular Systems", IEEE MTT-s Digest, 2001, pp. 241-244.

Numata, et al., "A High Power Handling GSM Switch IC with New Adaptive Control Voltage Generator Circuit Scheme", IEEE Radio Frequency Integrated Circuits Symposium, 2003, pp. 233-236.

Madihian, et al., "A High Speed Resonance Type FET Transceiver Switch for Millimeter Wave Band Wireless Networks", 26th EuMC, 1996, pp. 941-944.

Tokumitsu, et al., "A Low Voltage High Power T/R Switch MMIC Using LC Resonators", IEEE Transactions on Microwave Theory and Techniques, 1995, pp. 997-1003.

Colinge, et al., "A Low Voltage Low Power Microwave SOI MOSFET", IEEE International SOI Conference, 1996, pp. 128-129.

Johnson, et al., "A Model for Leakage Control by MOS Transistor Stacking", ECE Technical Papers, 1997, pp. 1-28.

Matsumoto, et al., "A Novel High Frequency Quasi-SOI Power MOSFET for Multi-Gigahertz Application", IEEE, 1998, pp. 945-948.

Giugni, "A Novel Multi-Port Microwave/Millimeter-Wave Switching Circuit", Microwave Conference, 2000.

Caverly, "A Project Oriented Undergraduate CMOS Analog Microelectronic System Design Course", IEEE, 1997, pp. 87-88.

Harjani, et al., "A Prototype Framework for Knowledge Based Analog Circuit Synthesis", IEEE Design Automation Conference, 1987, pp. 42-49.

DeRossi, et al., "A Routing Switch Based on a Silicon-on-Insulator Mode Mixer", IEEE Photonics Technology Letters, 1999, pp. 194-196.

(56) References Cited

OTHER PUBLICATIONS

Caverly, et al., "A Silicon CMOS Monolithic RF and Microwave Switching Element", 27th European Microwave Conference, 1997, pp. 1046-1051.
Valeri, et al., "A Silicon-on-Insulator Circuit for High Temperature, High-Voltage Applications", IEEE, 1991, pp. 60-61.
Barker, Communications Electronics-Systems, Circuits, and Devices, 1987, Prentice-Hall.
Carr, "Secrets of RF Circuit Design", McGraw-Hill, 1997.
Couch, "Digital and Analog Communication Systems", 2001, Prentice-Hall.
Couch, "Modern Telecommunication System", Prentice-Hall, 1995.
Freeman, "Radio System Design for Telecommunications", Wiley, 1997.
"An Ultra-Thin Silicon Technology that Provides Integration Solutions on Standard CMOS", Peregrine Semiconductor, 1998.
Caverly, "Distortion in RF and Microwave Control Devices", 1997.
Masuda, et al., "RF Current Evaluation of ICs by MP-10L", NEC Research & Development, vol. 40-41, 1999, pp. 253-258.
"Miniature Dual Control SP4T Switches for Low Cost Multiplexing", Hittite Microwave, 1995.
Uda, "Miniturization and High Isolation of a GaAs SPDT Switch IC Mounted in Plastic Package", 1996.
Marshall, et al., "SOI Design: Analog, Memory, and Digital Techniques", Kluwer Academic Publishers, 2002.
Bernstein, et al., "SOI Circuit Design Concepts", Springer Science + Business Media, 2000.
Brinkman, et al., Respondents' Notice of Prior Art, Investigation No. 337-TA-848, dated Aug. 31, 2012, 59 pgs.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999.
Stuber, et al., Supplemental Amendment filed in the USPTO dated Nov. 8, 2012 for related U.S. Appl. No. 13/028,144, 17 pgs.
Brindle, et al., Response and Terminal Disclaimer filed in the USPTO dated Dec. 26, 2012 for related U.S Appl. No. 13/277,108, 18 pgs.
Nguyen, Tram Hoang, Notice of Allowance received from the USPTO dated Nov. 12, 2010 for U.S. Appl. No. 11/484,370, 21 pgs.
Hoffmann, N., Summons to Attend Oral Proceedings pursuant to Rule 115(1) EPC received from the EPO dated Jul. 22, 2011 for related No. 06786943.8, 8 pgs.
Shingleton, Michael B., Advisory Action received from the USPTO dated Mar. 18, 2011 for related U.S. Appl. No. 11/881,816, 3 pgs.
Shingleton, Michael B., Interview Summary received from the USPTO dated Apr. 18, 2011 for related U.S. Appl. No. 11/881,816, 3 pgs.
Nguyen, Tram Hoang, Examiner Amendment received from the USPTO dated Nov. 1, 2010 for related U.S. Appl. No. 11/484,370, 7 pgs.
Suehle, et al., "Low Electric Field Breakdown of Thin SiO2 Films Under Static and Dynamic Stress", IEEE Transactions on Electron Devices, vol. 44, No. 5, May 1997, pp. 801-808.
Peregrine Semiconductor Corporation, Reply filed in the EPO dated Oct. 24, 2011 for related appln. No. 06786943.8, 1 pg.
Chinese Patent Office, a translation of a Chinese Office Action dated Nov. 2, 2011 for related appln. No. 2006800251281, 12 pgs.
Juhl, Andreas, Decision to refuse a European patent application received from the EPO dated Nov. 18, 2011 for related appln. No. 06786943.8-1528, 4 pgs.
Tat, Binh C., Office Action received from the USPTO dated Jan. 18, 2012 for related U.S. Appl. No. 13/028,144, 33 pgs.
Peregrine Semiconductor Corporation, Response to Communication filed in the EPO dated Aug. 12, 2009 for related application No. 06786943,8, 31 pgs.
Iperione, Analia, International Search Report and Written Opinion received from the EPO dated Nov. 7, 2006 for related appln. No. PCT/US2006/026965, 19 pgs.
Geier, Adolf, International Preliminary Report on Patentability received from the EPo dated Jun. 21, 2007 for related appln. No. PCT/US2006/026965, 12 pgs.
Stuber, et al., Proposed Amended Claims for Examiner's Consideration filed in the USPTO dated Aug. 27, 2010 for related U.S. Appl. No. 11/520,912, 11 pgs.
Stuber, et al., Comments on Examiner's Statement of Reasons for Allowance filed in the USPTO dated Dec. 15, 2010 for related U.S. Appl. No. 11/520,912, 5 pgs.
Huang, "A 0.5 um CMOS T/R Switch for 900-MHz Wireless Applications"; IEEE Journal of Solid-State Circuits, vol. 36, No. 3, Mar. 2001, pp. 486-492.
Lauterbach, et al. "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Makioka, et al., "Super Self-Aligned GaAs RF Switch IC with 0.25 dB Extremely Low Insertion Loss for Mobile Communication Systems", IEEE Transactions on Electron Devices, vol. 48, No. 8, Aug. 2001, pp. 1510-1514.
Tieu, Binh, Office Action received from the USPTO dated Jun. 3, 2005 for related U.S. Appl. No. 10/922,135, 8 pgs.
Rodgers, et al., "Silicon UTSi COMS RFIC for CDMA Wireless Communications Systems", Peregrine Semiconductor Corporation, 1999 IEEE MTT-S Digest, p. 485-488.
Megahed, et al., "Low Cost UTSI Technology for RF Wireless Applications", Peregrine Semiconductor Corporation, 1998 IEEE MTT-S Digest p. 981-984.
Burgener, et al., Amendment filed in the USPTO dated Dec. 5, 2005 for related U.S. Appl. No. 10/922,135, 7 pgs.
Burgener, CMOS SOS Switches Offer Useful Features, High Integration, CMOS SOS Switches, Microwaves & RF, Aug. 2001, p. 107-118.
Johnson, et al., "Advanced Thin-Film Silicon-on-Sapphire Technology: Microwave Circuit Applications", IEEE Transactions on Electron Devices, vol. 45, No. 5, May 1998, pp. 1047-1054.
Miyajima, Notice of Reasons for Refusal received from the Japanese Patent Office for appln. No. 2003-535287 dated Feb. 13, 2006, 3 pgs.
Tieu, Binh, Office Action received from USPTO dated Jan. 17, 2006 for related U.S. Appl. No. 10/922,135, 8 pgs.
Burgener, Response filed in the UPSTO including Terminal Disclaimer dated May 16, 2006 for U.S. Appl. No. 10/922,135, 3 pgs.
Tieu, Binh, Notice of Allowance received from the USPTO dated Jun. 2, 2006 for related U.S. Appl. No. 10/922,135, 5 pgs.
Tieu, Binh, Notice of Allowance received from the USPTO dated May 12, 2004 for related U.S. Appl. No. 10/267,531, 8 pgs.
Burgener, et al., Comments on Examiner's Statement of Reasons for Allowance dated Aug. 12, 2004 for related U.S. Appl. No. 10/267,531, 2 pgs.
Dribinsky, et al., Response filed in the USPTO dated Jan. 7, 2009 for related U.S. Appl. No. 11/881,816, 7 pgs.
Weman, Eva, Communication under Rule 71(3) EPC and Annex Form 2004 received from the European Patent Office for related appln. No. 02800982.7 dated Nov. 27, 2009, 68 pgs.
Kelly, Dylan, et al., Response and Terminal Disclaimers filed in the USPTO for related U.S. Appl. No. 11/347,014, dated Mar. 16, 2010, 10 pgs.
Dribinsky, et al., Response filed in the USPTO for related U.S. Appl. No. 11/881,816, dated Jul. 19, 2010, 22 pgs.
Tieu, Binh Kien, Notice of Allowance received from the USPTO for related U.S. Appl. No. 11/347,014, dated Apr. 29, 2010, 12 pgs.
Shingleton, Michael B., Office Action received from the USPTO dated Oct. 14, 2010 for related U.S. Appl. No. 11/881,816, 15 pgs.
Dribinsky, et al., Response filed in the USPTO dated Jan. 14, 2011 for related U.S. Appl. No. 11/881,816, 19 pgs.
Shifrin, Mitchell B., "Monolithic FET Structures for High-Power Control Component Applications", IEEE Transactions on Microwave Theory and Techniques, vol. 37, No. 12, Dec. 1989, pp. 2134-2141.
Miyajima, Ikumi, Notice of Reasons for Refusal received from the JPO dated Oct. 5, 2006 for related appln. No. 2003-535287, 4 pgs.

(56) References Cited

OTHER PUBLICATIONS

Tieu, Binh Kien, Office Action received from the USPTO dated Nov. 15, 2007 for related U.S. Appl. No. 11/582,206, 9 pgs.
Dinh, Le T., International Search Report received from the USRO dated Mar. 28, 2003 for related appln No. PCT/US02/32266, 2 pgs.
Burgener, et al., Amendment filed in the USPTO dated May 15, 2008 for related U.S. Appl. No. 11/582,206, 14 pgs.
Tieu, Binh Kien, Notice of Allowance received in the USPTO dated Jul. 15, 2008 for related U.S. Appl. No. 11/582,206, 7 pgs.
Van der Peet, H., Communication Pursuant to Article 94(3) EPC received from the EPO in related appln. No. 02800982.7-2220, dated Jun. 19, 2008, 3 pgs.
Caverly, Robert H., "A Silicon CMOS Monolithic RF and Microwave Switching Element", 1997 European Microwave Conference, Jerusalem, Sep. 1987, 4 pgs.
Van Der Peet, H., Communication pursuant to Article 94(3) EPC for related application No. 02800982.7-2220 dated Aug. 6, 2009, 2 pgs.
Tieu, Binh Kien, Office Action received from the USPTO dated Sep. 16, 2009 for related U.S. Appl. No. 11/347,014, 26 pgs.
Shingleton, Michael B, Notice of Allowance received from the USPTO for related U.S. Appl. No. 11/881,816, dated Oct. 12, 2011, 5 pgs.
Tieu, Binh Kien, Notice of Allowance received from the USPTO dated Aug. 11, 2010 for related U.S. Appl. No. 12/315,395, 26 pgs.
Kelly, et al., Comments on Examiner's Statement of Reasons for Allowance filed in the USPTO dated Jul. 29, 2010 for related U.S. Appl. No. 11/347,014, 2 pgs.
Chow, Charles Chiang, Office Action received from the USPTO dated Aug. 19, 2008 for related U.S. Appl. No. 11/347,671, 14 pgs.
Kelly, Dylan, Amendment filed in the USPTO dated Dec. 19, 2008 for related U.S. Appl. No. 11/347,671, 12 pgs.
Chow, Charles Chiang, Office Action received from the USPTO dated Apr. 16, 2009 for related U.S. Appl. No. 11/347,671, 16 pgs.
Kelly, Dylan, Response filed in the USPTO dated Jun. 16, 2009 for related U.S. Appl. No. 11/347,671, 14 pgs.
Nguyen, Tram Hoang, Notice of Allowance received from the USPTO dated Nov. 17, 2011 for U.S. Appl. No. 13/053,211, 41 pgs.
Chow, Charles Chiang, Office Action received from the USPTO dated Jul. 20, 2009 for related U.S. Appl. No. 11/347,671, 17 pgs.
Kelly, Dylan, Amendment filed in the USPTO dated Jan. 20, 2010 for related U.S. Appl. No. 11/347,671, 18 pgs.
Chow, Charles Chiang, Office Action received from the USPTO dated Apr. 28, 2010 for related U.S. Appl. No. 11/347,671, 20 pgs.
Kelly, Dylan, Amendment filed in the USPTO dated Jul. 28, 2010 for related U.S. Appl. No. 11/347,671, 6 pgs.
Chow, Charles Chiang, Office Action received from the USPTO dated Aug. 20, 2010 for related U.S. Appl. No. 11/347,671, 18 pgs.
Kelly, Dylan, Amendment filed in the USPTO dated Dec. 20, 2010 for related U.S. Appl. No. 11/347,671, 12 pgs.
Chow, Charles Chiang, Office Action received from the USPTO dated Mar. 2, 2011 for related U.S. Appl. No. 11/347,671, 15 pgs.
Kelly, Dylan, Amendment filed in the USPTO dated May 2, 2011 for related U.S. Appl. No. 11/347,671, 6 pgs.
Chow, Charles Chiang, Advisor Action received from the USPTO dated May 12, 2011 for related U.S. Appl. No. 11/347,671, 3 pgs.
Kelly, Dylan, Notice of Appeal filed in the USPTO dated Jun. 2, 2011 for related U.S. Appl. No. 11/347,671, 6 pgs.
Chow, Charles Chiang, Notice of Panel Decision from Pre-Appeal Brief Review dated Jul. 11, 2011 for related U.S. Appl. No. 11/347,671, 2 pgs.
Kelly, Dylan, Supplemental Amendment filed in the USPTO dated Aug. 9, 2011 for related U.S. Appl. No. 11/347,671, 2 pgs.
Chow, Charles Chiang, Notice of Allowance dated Aug. 16, 2011 for related U.S. Appl. No. 11/347,671, 12 pgs.
Hoffmann, Niels, International Search Report received from the EPO dated Feb. 27, 2012 for appln. No. PCT/US2011/056942, 12 pgs.
Iijima, M, et al., "Boosted Voltage Scheme with Active Body-Biasing Control on PD-SOI for Ultra Low Voltage Operation", IEICE Transactions on Electronics, Institute of Electronics, vol. E90C, No. 4, Apr. 1, 2007, pp. 666-674.
Peregrine Semiconductor Corporation, Response filed in the EPO dated Jan. 17, 2012 for related appln. No. 06786943.8, 1 pg.
Peregrine Semiconductor Corporation, Appeal to the Decision for Refusal filed in the EPO dated Mar. 20, 2012 for related appln No. 06786943.1, 27 pgs.
Peregrine Semiconductor Corporation, Response filed in the EPO dated May 16, 2011 for related appln No. 11153227.1, 5 pgs.
Hoffman, Niels, Extended Search Report received from the EPO dated May 4, 2012 for related appln. No. 11153227.1, 4 pgs.
Peregrine Semiconductor Corporation, Response filed in the EPO dated May 16, 2011 for related appln No. 11153247.9, 6 pgs.
Hoffman, Niels, Extended Search Report received from the EPO dated May 7, 2012 for related appln. No. 111153247.9, 4 pgs.
Peregrine Semiconductor Corporation, Response filed in the EPO dated May 16, 2011 for related appln No. 11153241.2, 5 pgs.
Hoffman, Niels, Extended Search Report received from the EPO dated May 7, 2012 for related appln. No. 11153241.2, 4 pgs.
Peregrine Semiconductor Corporation, Response filed in the EPO dated May 16, 2011 for related appln No. 11153281.8, 7 pgs.
Hoffman, Niels, Extended Search Report received from the EPO dated May 8, 2012 for related appln. No. 11153281.8, 4 pgs.
Peregrine Semiconductor Corporation, Response filed in the EPO dated May 16, 2011 for related appln No. 11153313.9, 8 pgs.
Hoffman, Niels, Extended Search Report received from the EPO dated May 8, 2012 for related appln. No. 11153313.9, 4 pgs.
Peregrine Semiconductor Corporation, Translation of Response filed in the Chinese Patent Office on Feb. 29, 2012 for related appln. No. 200680025128.7, 1 pg.
Peregrine Semiconductor Corporation, Translation of Response filed in the Chinese Patent Office on Jun. 20, 2012 for related appln. No. 200680025128.7, 12 pgs.
Shingleton, Michael B., Notice of Allowance received from the USPTO dated Jun. 4, 2012 for related U.S. Appl. No. 11/881,816, 13 pgs.
Stuber, et al., Response filed in the USPTO dated Feb. 21, 2012 for related U.S. Appl. No. 13/028,144, 3 pgs.
Tat, Binh C., Office Action received from the USPTO dated Apr. 12, 2012 for related U.S. Appl. No. 13/028,144, 19 pgs.
Unterberger, Michael, extended European Search Report received from the EPO dated Sep. 30, 2011 for related appln. No. 10011669.8-2220, 9 pgs.
Peregrine Semiconductor Corporation, Response filed in EPO dated May 15, 2012 for related appln. No. 10011669.8, 19 pgs.
Weman, Eva, Communication of a Notice of Opposition received from the EPO dated Nov. 8, 2011 for related appln. No. 028000982. 7, 33 pgs.
Kelly, Dylan, Amendment filed in the USPTO dated Dec. 20, 2012 for related U.S. Appl. No. 11/347,671, 10 pgs.
Kelly, Dylan, Comments on Examiner's Statement of Reasons for Allowance filed in the USPTO dated Nov. 16, 2011 for related U.S. Appl. No. 11/347,671, 4 pgs.
Nishide, Ryuji, Office Action and English translation received from the Japanese Patent Office dated Jul. 17, 2012 for related appln. No. 2008-521544, 4 pgs.
Stuber, et al., Response filed in the USPTO dated Aug. 3, 2012 for related U.S. Appl. No. 13/028,144, 6 pgs.
Peregrine Semiconductor Corporation, Demand filed in the EPO dated Aug. 17, 2012 for related appln. No. PCT/US2011/056942, 41 pgs.
Nguyen, Niki Hoang, Office Action received from the USPTO dated Sep. 26, 2012 for related U.S. Appl. No. 13/277,108, 47 pgs.
Cherne, et al., U.S. Statutory Invention Registration No. H1435, published May 2, 1995.
Matloubian, "Smart Body Contact for SOI MOSFETs", 1989 IEEE SOS/SOI Technology Conference, Oct. 1999, pp. 128-12.
Chuang, et al., "SOI for Digital CMOS VLSI Design: Design Consideration and Advances", Proceedings of the IEEE, vol. 86, No. 4, Apr. 1998, pp. 689-720.
Kuge, et al., "SOI-DRAM Circuit Technologies for Low Power High Speed Multigiga Scale Memories", IEEE Journal of Solid-State Circuits, vol. 31, No. 4, Apr. 1996, pp. 586-591.

(56) References Cited

OTHER PUBLICATIONS

Duyet, et al., "Suppression of Geometric Component of Charge Pumping Current in Thin Film Silicon on Insulator Metal-Oxide-Semiconductor Field-Effect Transistors", Japanese Journal of Applied Physics, vol. 37, Jul. 1998, pp. L855-L858.
Casu, et al., "Synthesis of Low-Leakage PD-SOI Circuits with Body Biasing", Int'l Symposium on Low Power Electronics and Design, Aug. 2001, pp. 287-290.
Wang, et al., "Threshold Voltage Instability at Low Temperatures in Partially Depleted Thin Film SOI MOSFET's", 1990 IEEE SOS/SOI Technology Conference, Oct. 1990, pp. 91-92.
Shimomura, et al., "TP 4.3: A 1V 46ns 16Mb SOI-DRAM with Body Control Technique", 1997 IEEE Int'l Solid-State Circuits Conference, Feb. 1997.
Assaderaghi, et al, "Transient Pass-Transistor Leakage Current in SOI MOSFET's", IEEE Electron Device Letters, vol. 18, No. 6, Jun. 1997, pp. 241-243.
Mashiko, et al., "Ultra-Low Power Operation of Partially-Depleted SOI/CMOS Integrated Circuits", IEICE Transactions on Electronic Voltage, No. 11, Nov. 2000, pp. 1697-1704.
Das, et al., "Ultra-Low-Leakage Power Strategies for Sub-1 V VLSI: Novel Circuit Styles and Design Methodologies for Partially Depleted Silicon-on-Insulator (PD-SOI) CMOS Technology", Proceedings of the 16th Int'l Conference on VLSI Design, 2003.
Pelloie, et al., "WP 25.2: SOI Technology Performance and Modeling", 1999 IEEE Int'l Solid-State Circuits Conference, Feb. 1999.
Goldman, et al., "0.15um SOI DRAM Technology Incorporating Sub-Volt Dynamic Threshold Devices for Embedded Mixed-Signal & RF Circuits", 2001 IEEE SOI Conference, Oct. 2001, pp. 97-98.
Hirota, et a., "0.5V 320MHz 8b Multiplexer/Demultiplexer Chips Based on a Gate Array with Regular-Structured DTMOS/SOI", ISSCC, Feb. 1998, pp. 12.2-1-12.2-11.
Fuse, et al., "0.5V SOI CMOS Pass-Gate Logic", 1996 IEEE Int'l Solid-State Circuits Conference, Feb. 1996, pp. 88-89,424.
Gibson, "The Communication Handbook", CRC Press, 1997.
Hanzo, "Adaptive Wireless Transceivers", Wiley, 2002.
Itoh, "RF Technologies for Low Power Wireless Communications", Wiley, 2001.
Lossee, "RF Systems, Components, and Circuits Handbook", Artech House, 1997.
Miller, "Modern Electronic Communications", Prentice-Hall, 1999.
Caverly, "Development of a CMOS Cell Library for RF Wireless and Telecommunications Applications", VLSI Symposium, 1998.
Caverly, "Distortion Properties of Gallium Arsenide and Silicon RF and Microwave Switches", IEEE, 1997, pp. 153-156.
Luu, Final Office Action received from the USPTO dated Apr. 2009 relating to U.S. Appl. No. 11/351,342.
Colinge, "Fully Depleted SOI CMOS for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
Eisenberg, et al., "High Isolation 1-20GHz MMIC Switches with On-Chip Drivers", IEEE Microwave and Millimeter-Wave Monolithic Circuits Symposium, 1989, pp. 41-45.
Shifrin et al., "High Power Control Components Using a New Monolithic FET Structure", IEEE Microwave and Millimeter-Wave Monolithic Circuits Symposium, 1988, pp. 51-56.
Kohama, et al., "High Power DPDT Antenna Switch MMIC for Digital Cellular Systems", GaAs IC Symposium, 1995, pp. 75-78.
Kohama, et al., "High Power DPDT Antenna Switch MMIC for Digital Cellular Systems", IEEE Journal of Solid-State Circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.

Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.
Masuda, et al., "High Power Heterojunction GaAs Switch IC with P-1dB of more than 38dBm for GSM Application", IEEE, 1998, pp. 229-232.
De Boer, et al., "Highly Integrated X-Band Multi-Function MMIC with Integrated LNA and Driver Amplifier", TNO Physics and Electronics Laboratory, 2002, pp. 1-4.
Kanda, et al., "High Performance 19GHz Band GaAs FET Switches Using LOXI (Layerd Oxide Isolation)—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct. 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays", Temic Semiconductors 1994, pp. 1-10.
Katzin, et al., "High Speed 100+ W RF Switches Using GaAs MMICs", IEEE Transactions on Microwave Theory and Techniques, 1992, pp. 1989-1996.
Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.
Kelly, "Integrated Ultra CMIS Designs in GSM Front End", Wireless Design Magazine, 2004, pp. 18-22.
Bonkowski, et al., "Integraton of Triple Band GSM Antenna Switch Module Using SOI CMOS", IEEE Radio Frequency Integrated Circuits Symposium, 2004, pp. 511-514.
Le, International Search Report from the USPTO dated Mar. 2003 relating to U.S. Appl. No. 10/267,531.
Marenk, et al., "Layout Optimization of Cascode RF SOI Transistors", IEEE International SOI Conference, 2001, pp. 105-106.
Suematsu, et al., "L-Band Internally Matched Si-MMIC Front End", IEEE, 1996, pp. 2375-2378.
Iyama, et al., "L-Band SPDT Switch Using Si-MOSFET", IEICE Trans. Electron, vol. E79-C, No. 5, May 1996, pp. 636-643.
Caverly, "Linear and Nonlinear Characteristics of the Silicon CMOS Monolithic 50-Omega Microwave and RF Control Element", IEEE Journal of Solid-State Circuits, 1999, pp. 124-126.
Adan, et al., "Linearity and Low Noise Performance of SOIMOSFETs for RF Applications", IEEE International SOI Conference, 2000, pp. 30-31.
Sudhama, et al., "Compact Modeling and Circuit Impact of a Novel Frequency Dependence of Capacitance in RF MOSFETs", Nano Science and Technology Institute, Technical Proceedings of the 2001 Int'l Conference of Modeling and Simulation of Microsystems. 2001.
Casu, et al., "Comparative Analysis of PD-SOI Active Body-Biasing Circuits", IEEE Int'l SOI Conference, Oct. 2000, pp. 94-95.
Cho, et al., "Comparative Assessment of Adaptive Body-Bias SOI Pass-Transistor Logic", Fourth Int'l Symposium on Quality Electronic Design, Mar. 2003, pp. 55-60.
Chan, et al., "Comparative Study of Fully Depleted and Body-Grounded Non Fully Depleted SOI MOSFET's for High Performance Analog and Mixed Signal Circuits", IEEE Transactions on Electron Devices, vol. 42, No. 11, Nov. 1995, pp. 1975-1981.
Tseng, et al. "Comprehensive Study on AC Characteristics in SOI MOSFETs for Analog Applications", 1998 Symposium on VLSI Technology Digest of Technical Papers, Jun. 1998.

(56) References Cited

OTHER PUBLICATIONS

Pelella, et al., "Control of Off-State Current in Scaled PD/SOI CMOS Digital Circuits", Proceedings IEEE Int'l SOI Conference, Oct. 1998, pp. 147-148.
Assaderaghi, "DTMOS: Its Derivatives and Variations, and Their Potential Applications", The 12th Int'l Conference on Microelectronics, Nov. 2000, pp. 9-10.
Giffard, B., et al., "Dynamic Effects in SOI MOSFET's" IEEE 1991, pp. 160-161.
Lindert, et al. "Dynamic Threshold Pass-Transistor Logic for Improved Delay at Lower Power Supply Voltages", IEEE Journal of Solid-State Circuits, vol. 34, No. 1, Jan. 1999, pp. 85-89.
Drake, et al., "Dynamic-Threshold Logic for Low Power VLSI Design", www.research.ibm.com/acas, 2001.
Wei, et al., "Effect of Floating-Body Charge on SOI MOSFET Design", IEEE Transaction on Electron Devices, vol. 45, No. 2, Feb. 1998.
Duyet, et al., "Effects of Body Reverse Pulse Bias on Geometric Component of Charge Pumping Current in FD SOI MOSFETs", Proceedings IEEE Int'l SOI Conference, Oct. 1998, pp. 79-80.
Krishnan, "Efficacy of Body Ties Under Dynamic Switching Conditions in Partially Depleted SOI CMOS Technology", Proceedings IEEE Int'l SOI Conference, Oct. 1997, pp. 140-141.
Lu, et al., "Floating Body Effects in Partially Depleted SOI CMOS Circuits", ISPLED, Aug. 1996, pp. 1-6.
Ueda, et al., "Floating Body Effects on Propagation Delay in SOI/CMOS LSIs", IEEE SOI Conference, Oct. 1996, pp. 142-143.
Matsumoto, et al., "Fully Depleted 30-V-Class Thin Film SOI Power MOSFET", IEDM 95-979, 1995, pp. 38.6.1-38.6.4.
Assaderaghi, et al., "History Dependence of Non-Fully Depleted (NFD) Digital SOI Circuits", 1996 Symposium on VLSI Technology Digest of Technical Papers 13.1, 1996, pp. 122-123.
Damiano, et al., "Integrated Dynamic Body Contact for H Gate PD SOI MOSFETs for High Performance/Low Power", IEEE SOI Conference, Oct. 2004, pp. 115-116.
Rauly, et al., Investigation of Single and Double Gate SOI MOSFETs in Accumulation Mode for Enhanced Performances and Reduced Technological Drawbacks, Proceedings 30th European Solid-State Device Research Conference, Sep. 2000, pp. 540-543.
Morishita, et al., "Leakage Mechanism Due to Floating Body and Countermeasure on Dynamic Retention Mode of SOI-DRAM", 1995 Symposium on VLSI Technology Digest of Technical Papers, Apr. 1995, pp. 141-142.
Keys, "Low Distortion Mixers or RF Communications", Ph.D. Thesis, University of California-Berkeley, 1995.
Chen, et al., "Low Power, Multi-Gigabit DRAM Cell Design Issues Using SOI Technologies", http://bwrc.eecs.berkeley.edu/people/grad_students/chenff/reports, May 1999.
Pelella, et al., "Low-Voltage Transient Bipolar Effect Induced by Dynamic Floating-Body Charging in Scaled PD/SOI MOSFET's", IEEE Electron Device Letters, vol. 17, No. 5, May 1996.
Wei, "Measurement and Modeling of Transient Effects in Partially Depleted SOI MOSFETs", M.S. Thesis, MIT, Jul. 1996.
Shoucair, "Modeling, Decoupling and Supression of MOSFET Distortion Components", IEEE Proceeding Circuit Devices Systems, vol. 146, No. 1, Feb. 1999.
Shahidi, et al., "Partially Depleted SOI Technology for Digital Logic", IEEE Int'l Solid-State Circuits Conference, 1999, pp. 426-427.
Yamamoto, et al., "A Single-Chip GaAs RF Transceiver for 1.9GHz Digital Mobile Communication Systems", IEEE Journal of Solid-State Circuits, 1996.
Tsutsumi, et al., "A Single Chip PHS Front End MMIC with a True Single + Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5 GHz, IEEE Transactions on Electron Devices, 1997, pp. 1981-1989.
Szedon, et al., "Advanced Silicon Technology for Microwave Circuits", Naval Research Laboratory, 1994, pp. 1-110.
Kai, An English translation of an Office Action received from the Japanese Patent Office dated Jul. 2010 relating to appln. No. 2007-518298.
Burgener, et al., Amendment filed in the USPTO dated Apr. 2010 relating to U.S. Appl. No. 11/501,125.
Heller, et al., "Cascode Voltage Switch Logic: A Different CMOS Logic Family", IEEE International Solid-State Circuits Conference, 1984, pp. 16-17.
Pylarinos, "Charge Pumps: An Overview", Proceedings of the IEEE International Symposium on Circuits and Systems, 2003, pp. 1-7.
Doyama, "Class E Power Amplifier for Wireless Transceivers", University of Toronto, 1999, pp. 1-9.
"CMOS Analog Switches", Harris, 1999, pp. 1-9.
"CMOS SOI RF Switch Family", Honeywell, 2002, pp. 1-4.
"CMOS SOI Technology", Honeywell, 2001, pp. 1-7.
Analog Devices, "CMOS, Low Voltage RF/Video, SPST Switch", Analog Devices, inc., 1999, pp. 1-10.
Eggert, et al., "CMOS/SIMOX-RF-Frontend for 1.7GHz", Solid State Circuits Conference, 1996.
Aquilani, Communication and supplementary European Search Report dated Nov. 2009 relating to appln. No. 05763216.
Aquilani, Communications pursuant to Article 94(3) EPC received from the EPO dated Mar. 2010 relating to appln. No. 05763216.8.
Yamamoto, et al., "Design and Experimental Results of a 2V-Operation Single-Chip GaAs T/R MMIC Front-End for 1.9GHz Personal Communications", IEEE, 1998, pp. 7-12.
Savla, "Design and Simulation of a Low Power Bluetooth Transceiver", The University of Wisconsin, 2001, pp. 1-90.
Henshaw, "Design of an RF Transceiver", IEEE Colloquium on Analog Signal Processing, 1998.
Baker, et al., "Designing Nanosecond High Voltage Pulse Generators Using Power MOSFET's", Electronic Letters, 1994, pp. 1634-1635.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
Koudymov, et al., "Low Loss High Power RF Switching Using Multifinger AlGaN/GaN MOSHFETs", University of South Carolina Scholar Commons, 2002, pp. 449-451.
Abidi, "Low Power Radio Frequency IC's for Portable Communications", IEEE, 1995, pp. 544-569.
De La Houssaye, et al., "Microwave Performance of Optically Fabricated T-Gate Thin Film Silicon on Sapphire Based MOSFET's", IEEE Electron Device Letters, 1995, pp. 289-292.
"Radiation Hardened CMOS Dual DPST Analog Switch", Intersil, 1999, pp. 1-2.
Smuk, et al., "Monolithic GaAs Multi-Throw Switches with Integrated Low Power Decoder/Driver Logic", 1997, IEEE Radio Frequency Integrated Circuits.
McGrath, et al., "Multi Gate FET Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon FET-Based RF and Microwave Switches", IEEE, 1998, pp. 1-4.
Tran, Notice of Allowance and Fee(s) Due from the USPTO dated Jun. 10, 2010 relating to U.S. Appl. No. 11/501,125.
Tieu, Notice of Allowance and Fee(s) Due from the USPTO dated Dec. 19, 2008 relating to U.S. Appl. No. 11/127,520.
Luu, Notice of Allowance and Fee(s) Due from the USPTO dated Jul. 2, 2009 relating to U.S. Appl. No. 11/351,342.
McGrath, et al., "Novel High Performance SPDT Power Switches Using Multi-Gate FET's", IEEE, 1991, pp. 839-842.
Luu, Office Action from the USPTO dated Oct. 30, 2008 relating to U.S. Appl. No. 11/351,342.

(56) References Cited

OTHER PUBLICATIONS

Suematsu, "On-Chip Matching SI-MMIC for Mobile Communication Terminal Application", IEEE, 1997, pp. 9-12.
Caverly, et al., "On-State Distortion in High Electron Mobility Transistor Microwave and RF Switch Control Circuits", IEEE Transactions on Microwave Theory and Techniques, 2000, pp. 98-103.
Kelly, Proposed Amendment After Final from the USPTO dated Jun. 8, 2009 relating to U.S. Appl. No. 11/351,342.
Drozdovsky, et al., "Large Signal Modeling of Microwave Gallium Nitride Based HFETs", Asia Pacific Microwave Conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.
"A Voltage Regulator for GaAs FETs", Microwave Journal, 1995.
Slobodnik, et al., "Millimeter Wave GaAs Switch FET Modeling", Microwave Journal, 1989.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.
Koh, et al., "Low-Voltage SOI CMOS VLSI Devices and Circuits", Wiley Interscience, XP001090589, New York, 2001, pp. 57-60, 349-354.
Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 2.45 GHz Wireless Commercial Products", Microwave and Millimeter-Wave Monolithic Circuits Symposium, 1994, pp. 15-18.
Caverly, et al., "CMOS RF Circuits for Integrated Wireless Systems", IEEE, 1998, pp. 1-4.
Devlin, et al., "A 2.4 GHz Single Chip Transceiver", Microwave and Millimeter-Wave Monolithic Circuits Symposium, 1993, pp. 23-26.
Fiorenza, et al., "RF Power Performance of LDMOSFETs on SOI: An Experimental Comparison with Bulk Si MOSFETs", IEEE Radio Frequency Integrated Circuits Symposium, 2001, pp. 43-46.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODFETs", IEEE, 1997, pp. 669-672.
Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band SOS Resistive Gate Insulator Semiconductor (RIS) Switch", IEEE Transactions on Electron Device, 1980, pp. 442-448.
Lee, "CMOS RF: (Still) No Longer an Oxymoron (Invited)", IEEE Radio Frequency Integrated Circuits Symposium, 1999, pp. 3-6.

Madihian, et al., "A 2-V, 1-10GHz BiCMOS Transceiver Chip for Multimode Wireless Communications Networks", IEEE, 1997, pp. 521-525.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.
Nishijima, et al., "A High Performance Transceiver Hybrid IC for PHS Hand Set Operating with Single Positive Voltage Supply", Microwave Symposium Digest, 1997, pp. 1155-1158.
O. et al., "CMOS Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace Conference Proceedings, 2002, pp. 2013-2017.
Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Shimura, et al., "High Isolation V-Band SPDT Switch MMIC for High Power Use", IEEE MTT-S International Microwave Symposium Digest, 2001, pp. 245-248.
Uda, et al., "A High Performance and Miniturized Dual Use (antenna/local) GaAs SPDT Switch IC Operating at +3V/0V", Microwave Symposium Digest, 1996, pp. 141-144.
Uda, et al., "High Performance GaAs Switch IC's Fabricated Using MESFETs with Two Kinds of Pinch Off Voltages and a Symmetrical Pattern Configuration", IEEE Journal of Solid-State Circuits, 1994, pp. 1262-1269.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Park, "A Regulated, Charge Pump CMOS DC/DC Converter for Low Power Application", 1998, pp. 1-62.
Hittite Microwave, Floating Ground SPNT MMIC Switch Driver Techniques, 2001.
Caverly, et al., "Gallium Nitride-Based Microwave and RF Control Devices", 2001.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Ionescu, et al., "A Physical Analysis of Drain Current Transients at Low Drain Voltage in Thin Film SOI MOSFETs", Microelectronic Engineering 28 (1995), pp. 431-434.
Suh, et al., "A Physical Charge-Based Model for Non-Fully Depleted SOI MOSFET's and Its Use in Assessing Floating-Body Effects in SOI CMOS Circuits", IEEE Transactions on Electron Devices, vol. 42, No. 4, Apr. 1995, pp. 728-737.
Wang, et al., "A Robust Large Signal Non-Quasi-Static MOSFET Model for Circuit Simulation", IEEE 2004 Custom Integrated Circuits Conference, pp. 2-1-1 through 2-1-4.
Han, et al., "A Simple and Accurate Method for Extracting Substrate Resistance of RF MOSFETs", IEEE Electron Device Letters, vol. 23, No. 7, Jul. 2002, pp. 434-436.
Linear Systems, "High-Speed DMOS FET Analog Switches and Switch Arrays", 11 pgs.
Terauchi, et al., "A 'Self-Body-Bias' SOI MOSFET: A Novel Body-Voltage-Controlled SOI MOSFET for Low Voltage Applications", The Japan Sociey of Applied Physics, vol. 42 (2003), pp. 2014-2019, Part 1, No. 4B, Apr. 2003.
Dehan, et al., "Dynamic Threshold Voltage MOS in Partially Depleted SOI Technology: A Wide Frequency Band Analysis", Solid-State Electronics 49 (2005), pp. 67-72.
Kuroda, et al., "A 0.9-V, 150-MHz, 10-mW, 4 mm2, 2-D Discrete Cosine Transform Core Processor with Variable Threshold-Voltage (VT) Scheme", IEEE Journal of Solid-State Circuits, vol. 31, No. 11, Nov. 1996, pp. 1770-1779.
Kuroda, et al., "A 0.9-V, 150-MHz, 10-mW, 4 mm2, 2-D Discrete Cosine Transform Core Processor with Variable-Threshold-Voltage

(56) References Cited

OTHER PUBLICATIONS

Scheme", Technical Paper, 1996 IEEE International Solid-State Circuits Conference, 1996 Digest of Technical Papers, pp. 166-167.
Cathelin, et al., "Antenna Switch Devices in RF Modules for Mobile Applications", ST Microelectronics, Front-End Technology and Manufacturing, Crolles, France, Mar. 2005, 42 pgs.
Cristoloveanu, Sorin, "State-of-the-art and Future of Silicon on Insulator Technologies, Materials, and Devices", Microelectronics Reliability 40 (2000), pp. 771-777.
Sivaram, et al., "Silicon Film Thickness Considerations in SOI-DTMOS", IEEE Device Letters, vol. 23, No. 5, May 2002, pp. 276-278.
Drake, et al., "Analysis of the Impact of Gate-Body Signal Phase on DTMOS Inverters in 0.13um PD-SOI", Department of EECS, University of Michigan, Ann Arbor, MI, Sep./Oct. 2003, 4 pgs.
Drake, et al., "Analysis of the Impact of Gate-Body Signal Phase on DTMOS Inverters in 0.13um PD-SOI", Department of EECS, University of Michican, Ann Arbor, MI, Sep./Oct. 2003,16 pgs.
Drake, et al., Evaluation of Dynamic-Threshold Logic for Low-Power VLSI Design in 0.13um PD-SOI, University of Michigan, Ann Arbor, MI, Dec. 2003, 29 pgs.
Imam, et al., "A Simple Method to Determine the Floating-Body Voltage of SOI CMOS Devices", IEEE Electron Device Letters, vol. 21, No. 1, Jan. 2000, pp. 21-23.
Dehan, et al., "Alternative Architectures of SOI MOSFET for Improving DC and Microwave Charactersitrics", Microwave Laboratory, Universite catholique de Louvain, Sep. 2001, 4 pgs.
Colinge, Jean-Pierre, "An SOI Voltage-Controlled Bipolar-MOS Device", IEEE Transactions on Electron Devices, vol. ED-34, No. 4, Apr. 1987, pp. 845-849.
Pelella, et al., "Analysis and Control of Hysteresis in PD/SOI CMOS", University of Florida, Gainesville, FL., 1999 IEEE, pp. 34.5.1 through 34.5.4.
Adriaensen, et al., "Analysis and Potential of the Bipolar- and Hybrid-Mode Thin-Film SOI MOSFETs for High-Temperature Applications", Laboratoire de Microelectronique, Universite catholique de Louvain, May 2001, 5 pgs.
Gentinne, et al., "Measurement and Two-Dimensional Simulation of Thin-Film SOI MOSETs: Intrinsic Gate Capacitances at Elevated Temperatures", Solid-State Electronics, vol. 39, No. 11, pp. 1613-1619, 1996.
Su, et al., "On the Prediction of Geometry-Dependent Floating-Body Effect in SOI MOSFETs", IEEE Transactions on Electron Devices, vol. 52, No. 7, Jul. 2005, pp. 1662-1664.
Dehan, et al., "Partially Depleted SOI Dynamic Threshold MOSFET for low-voltage and microwave applications", 1 pg.
Fung, et al., "Present Status and Future Direction of BSIM SOIL Model for High-Performance/Low-Power/RF Application", IBM Microelectronics, Semiconductor Research and Development Center, Apr. 2002, 4 pgs.
Weigand, Christopher, "An ASIC Driver for GaAs FET Control Components", Technical Feature, Applied Microwave & Wireless, 2000, pp. 42-48.
Lederer, et al., "Frequency degradation of SOI MOS device output conductance", Microwave Laboratory of UCL, Belgium, IEEE 2003, pp. 76-77.
Lederer, et al., "Frequency degradation of SOI MOS device output conductance", Microwave Laboratory of Universite catholique de Louvain, Belgium, Sep./Oct. 2003, 1 pg.
Cheng, et al., "Gate-Channel Capacitance Characteristics in the Fully-Depleted SOI MOSFET", IEEE Transactions on Electron Devices, vol. 48, No. 2, Feb. 2001, pp. 388-391.
Ferlet-Cavrois, et al., "High Frequency Characterization of SOI Dynamic Threshold Voltage MOS (DTMOS) Transistors", 1999 IEEE International SOI Conference, Oct. 1999, pp. 24-25.
Yeh, et al., "High Performance 0.1um Partially Depleted SOI CMOSFET", 2000 IEEE International SOI Conference, Oct. 2000, pp. 68-69.

Bawedin, et al., "Unusual Floating Body Effect in Fully Depleted MOSFETs", IMEP, Enserg, France and Microelectronics Laboratory, UCL, Belgium, Oct. 2004, 22 pgs.
Flandre, et al., "Design of EEPROM Memory Cells in Fully Depleted 'CMOS SOI Technology'", Catholic University of Louvain Faculty of Applied Science, Laboratory of Electronics and Microelectronics, Academic Year 2003-2004, 94 pgs.
Takamiya, et al., "High-Performance Accumulated Back-Interface Dynamic Threshold SOI MOSFET (AB-DTMOS) with Large Body Effect at Low Supply Voltage", Japanese Journal of Applied Physics, vol. 38 (1999), Part 1, No. 4B, Apr. 1999, pp. 2483-2486.
Drake, et al., "Evaluation of Dynamic-Threshold Logic for Low-Power VLSI Design in 0.13um PD-SOI", IFIP VLSI-SoC 2003, IFIP WG 10.5 International Conference on Very Large Scale Integration of System-on-Chip, Darmstadt, Germany, Dec. 1-3, 2003.
Huang, et al., "Hot Carrier Degradation Behavior in SOI Dynamic-Threshold-Voltage nMOSFET's (n-DTMOSFET) Measured by Gated-Diode Configuration", Microelectronics Reliability 43 (2003), pp. 707-711.
Goo, et al., "History-Effect-Conscious SPICE Model Extraction for PD-SOI Technology", 2004 IEEE International SOI Conference, Oct. 2004, pp. 156-158.
Workman, et al., "Dynamic Effects in BTG/SOI MOSFETs and Circuits Due to Distributed Body Resistance", Proceedings 1997 IEEE International SOI Conference, Oct. 1997, pp. 28-29.
Ernst, et al., "Detailed Analysis of Short-Channel SOI DT-MOSFET", Laboratoire de Physique des Composants a Semiconducteurs, Enserg, France, Sep. 1999, pp. 380-383.
Huang, et al., "Device Physics, Performance Simulations and Measured Results of SOI MOS and DTMOS Transistors and Integrated Circuits", Beijing Microelectronics Technology Institute, 1998 IEEE, pp. 712-715.
Bernstein, et al., "Design and CAD Challenges in sub-90nm CMOS Technologies", IBM Thomas J. Watson Research Center, NY, Nov. 11-13, 2003, pp. 129-136.
Wiatr, et al., "Impact of Floating Silicon Film on Small-Signal Parameters of Fully Depleted SOI-MOSFETs Biased into Accumulation", Solid-State Electronics 49 (2005), Received 9/11/30, revised on Nov. 9, 2004, pp. 779-789.
Gritsch, et al., "Influence of Generation/Recombination Effects in Simulations of Partially Depleted SOI MOSFETs", Solid-State Electronics 45 (2001), pp. 621-627.
Chang, et al., "Investigations of Bulk Dynamic Threshold-Voltage MOSFET with 65 GHz "Normal-Mode" Ft and 220GHz "Over-Drive Mode" Ft for RF Applications", Institute of Electronics, National Chiao-Tung Universtiy, Taiwan, 2001 Symposium on VLSI Technology Digest of Technical Papers, pp. 89-90.
Le TMOS en technologie SOI, 3.7.2.2 Pompage de charges, pp. 110-111.
Horiuchi, Masatada, "A Dynamic-Threshold SOI Device with a J-FET Embedded Source Structure and a Merged Body-Bias-Control Transistor—Part I: A J-FET Embedded Source Structure Properties", IEEE Transactions on Electron Devices, vol. 47, No. 8, Aug. 2000, pp. 1587-1592.
Horiuchi, Masatada, "A Dynamic-Threshold SOI Device with a J-FET Embedded Source Structure and a Merged Body-Bias-Control Transistor—Part II: Circuit Simulation", IEEE Transactions on Electron Devices, vol. 47, No. 8, Aug. 2000, pp. 1593-1598.
Casu, Mario Roberto, "High Performance Digital CMOS Circuits in PD-SOI Technology: Modeling and Design", Tesi di Dottorato di Recerca, Gennaio 2002, Politecnico di Torino, Corso di Dottorato di Ricerca in Ingegneria Elettronica e delle Communicazioni, 200 pgs.
Tinella, Carlo, "Study of the potential of CMOS-SOI technologies partially abandoned for radiofrequency applications", Thesis for obtaining the standard of Doctor of INPG, National Polytechnic of Grenoble, Sep. 25, 2003, 187 pgs.
Newman, "Radiation Hardened Power Electronics", Intersil Corporation, 1999, pp. 1-4.
Kelly, Response and Terminal Disclaimer filed in the USPTO dated Mar. 2010 relating to U.S. Appl. No. 11/347,014.
Kelly, Response to Office Action mailed to USPTO relating to U.S. Appl. No. 11/351,342 dated Jan. 30, 2009.

(56) References Cited

OTHER PUBLICATIONS

"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.
Huang, "Schottky Clamped MOS Transistors for Wireless CMOS Radio Frequency Switch Application", University of Florida, 2001, pp. 1-167.
Botto, et al., "Series Connected Soft Switched IGBTs for High Power, High Voltage Drives Applications: Experimental Results", IEEE, 1997, pp. 3-7.
Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.
Reedy, et al., "Single Chip Wireless Systems Using SOI", IEEE International SOI Conference, 1999, pp. 8-11.
Stuber, et al., "SOI CMOS with High Performance Passive Components for Analog, RF and Mixed Signal Designs", IEEE International SOI Conference, 1998, pp. 99-100.
Chung, et al., "SOI MOSFET Structure with a Junction Type Body Contact for Suppression of Pass Gate Leakage", IEEE Transactions on Electron Devices, vol. 48, No. 7, Jul. 2001.
Fukuda, et al., "SOI CMOS Device Technology", Special Edition on 21st Century Solutions, 2001, pp. 54-57.
Kusunoki, et al., "SPDT Switch MMIC Using E/D Mode GaAs JFETs for Personal Communications", IEEE GaAs IC Symposium, 1992, pp. 135-138.
Caverly, et al., "SPICE Modeling of Microwave and RF Control Diodes", IEEE, 2000, pp. 28-31.
Baker, et al., "Stacking Power MOSFETs for Use in High Speed Instrumentation", American Institute of Physics, 1992, pp. 5799-5801.
Sanders, "Statistical Modeling of SOI Devices for the Low Power Electronics Program", AET, Inc., 1995, pp. 1-109.
Maeda, et al., "Substrate Bias Effect and Source Drain Breakdown Characteristics in Body Tied Short Channel SOI MOSFETs", IEEE Transactions on Electron Devices, vol. 46, No. 1, Jan. 1999, pp. 151-158.
Karandikar, et al., "Technology Mapping for SOI Domino Logic Incorporating Solutions for the Parasitic Bipolar Effect", ACM, 2001, pp. 1-14.
Huang, et al., "TFSOI Can It Meet the Challenge of Single Chip Portable Wireless Systems", IEEE International SOI Conference, 1997, pp. 1-3.
Devlin, "The Design of Integrated Switches and Phase Shifters", 1999.
Hess, et al., "Transformerless Capacitive Coupling of Gate Signals for Series Operation of Power MOS Devices", IEEE, 1999, pp. 673-675.
"uPG13xG Series L-Band SPDT Switch GaAs MMIC", NEC, 1996, pp. 1-30.
Reedy, et al., "UTSi CMOS: A Complete RF SOI Solution", Peregrine Semiconductor, 2001, pp. 1-6.
Hittite Microwave, "Wireless Symposium 2000 is Stage for New Product Introductions", Hittite Microwave, 2000, pp. 1-8.
Montoriol, et al., "3.6V and 4.8V GSM/DCS1800 Dual Band PA Application with DECT Capability Using Standard Motorola RFICs", 2000, pp. 1-20.

Wang, et al., "Efficiency Improvement in Charge Pump Circuits", IEEE Journal of Solid-State Circuits, vol. 32, No. 6, Jun. 1997, pp. 852-860.
Nguyen, Tram Hoang, Office Action received from the USPT dated Apr. 11, 2012 for U.S. Appl. No. 13/412,529, 6 pgs.
Brindle, et al., Amendment filed in the USPTO dated Oct. 11, 2012 for U.S. Appl. No. 13/412,529, 15 pgs.
Nguyen, Tram Hoang, Notice of Allowance received from the USPTO dated Feb. 8, 2013 for U.S. Appl. No. 13/412,529, 19 pgs.
Nguyen, Tram Hoang, Notice of Allowance received from the USPTO dated Jan. 17, 2013 for U.S. Appl. No. 13/412,529, 19 pgs.
Brindle, et al., Comments on Examiner's Statement of Reasons for Allowance filed in the USPTO dated Feb. 8, 2013 for U.S. Appl. No. 13/412,529, 4 pgs.
Brindle, et al., Amendment filed in the USPTO dated Dec. 19, 2012 or U.S. Appl. No. 13/412,529, 15 pgs.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Unterberger, M., Summons to attend oral proceedings pursuant to Rule 115(1) EPC received from EPO dated Oct. 17, 2013 for related appln. No. 02800982.7, 15 pgs.
Huber & Schussler, Report on Decision in EPO Opposition Division for related appln. No. 02800982.7-2220 dated Feb. 25, 2014, 13 pgs.
Dribinsky, et al., Notice of Appeal and Pre-Appeal Brief Request for Review filed in the USPTO dated Feb. 20, 2014 for related U.S. Appl. No. 11/881,816, 7 pgs.
Dribinsky, et al., Response filed in the USPTO dated Feb. 4, 2014 for related U.S. Appl. No. 11/881,816, 20 pgs.
Shingleton, Michael, Advisory Action received from the USPTO dated Feb. 19, 2014 or related U.S. Appl. No. 11/881,816, 3 pgs.
Tat, Binh C., Office Action received from the USPTO dated May 23, 2014 for related U.S. Appl. No. 13/948,094, 7 pgs.
Unterberger, Michael, Communication pursuant to Article 101(1) and Rule 81(2) to (3) received from the EPO dated Mar. 3, 2014 for related appln. No. 02800982.7, 3 pgs.
Weman, Eva, Provision of a the minutes in accordance with Rule 124(4) EPC received from the EPO dated Apr. 10, 2014 for related appln. No. 02800982.7, 9 pgs.
European Patent Office, Brief Communication received from the EPO dated May 8, 2014 for related appln. No. 02800982.7, 2 pgs.
Peregrine Semiconductor Corporation, Reply filed in the EPO dated May 8, 2014 for related appln. No. 02800982.7, 79 pgs.
Unterberger, Michael, Communication pursuant to Article 94(3) EPC received from the EPO dated Apr. 9, 2014 for related appln. No. 10011669.8, 5 pgs.
Tieu, Binh Kien, Office Action received from the USPTO dated Jun. 24, 2014 for related U.S. Appl. No. 14/062,791, 7 pgs.
Peregrine Semiconductor Corporation, English translation of Response filed in the JPO dated Jul. 3, 2014 for related appln. No. 2013-003388, 14 pgs.
Tat, Binh C., Notice of Allowance received from the USPTO dated Jul. 18, 2014 for related U.S. Appl. No. 13/028,144, 29 pgs.
Nguyen, Niki Hoang, Notice of Allowance received from the USPTO dated Aug. 20, 2014 for related U.S. Appl. No. 14/198,315, 11 pgs.
Tat, Binh C., Notice of Allowance received from the USPTO dated Oct. 1, 2014 for related U.S. Appl. No. 13/028,144, 15 pgs.
European Patent Office, Communication received from the EPO dated Aug. 14, 2014 for related appln. No. 02800982.7, 2 pgs.
Peregrine Semiconductor Corporation, Response filed in the EPO dated Oct. 14, 2014 for appln. No. 10011669.8, 30 pgs.
Tat, Binh C., Office Action received from the USPTO dated Jan. 2, 2015 for U.S. Appl. No. 13/948,094, 187 pgs.

(56) References Cited

OTHER PUBLICATIONS

Stuber, et al., Response/Amendment filed in the USPTO dated Oct. 23, 2014 for U.S. Appl. No. 13/948,094, 28 pgs.
Burgener, et al., Response filed in the USPTO dated Nov. 24, 2014 for U.S. Appl. No. 14/062,791, 8 pgs.
Tat, Binh C., Notice of Allowance received from the USPTO dated Dec. 5, 2014 for U.S. Appl. No. 13/028,144, 13 pgs.
Stuber, et al., Comments on Examiners Statement of Reasons for Allowance filed in the USPTO dated Dec. 8, 2014 for U.S. Appl. No. 13/028,144, 4 pgs.
European Patent Office, Brief Communication received from the EPO dated Oct. 24, 2014 for appln. No. 02800982.7, 2 pgs.
La Casta Munoa, et al., Interlocutory Decision in Opposition Proceedings received from the EPO dated Oct. 31, 2014 or appln. No. 02800982.7, 77 pgs.
Tieu, Binh Kien, Notice of Allowance received from the USPTO dated Jan. 23, 2015 for U.S. Appl. No. 14/062,791, 8 pgs.
Brindle, et al., Notice of Allowance received from the USPTO dated Feb. 3, 2015 for U.S. Appl. No. 14/198,315, 10 pgs.
Stuber, et al., Response/Amendment filed in the USPTO dated Mar. 2, 2015 for U.S. Appl. No. 13/948,094, 11 pgs.
Tat, Binh C., Office Action received from the USPTO dated Mar. 27, 2015 for U.S. Appl. No. 13/948,094, 23 pgs.
Shingleton, Michael, Office Action received from the USPTO dated Apr. 10, 2015 for U.S. Appl. No. 14/257,808, 8 pgs.
Tieu, Binh Kien, Notice of Allowance received from the USPTO dated May 14, 2015 for U.S. Appl. No. 14/062,791, 211 pgs.
Nguyen, Niki Hoang, Office Action received from the USPTO dated Oct. 2, 2013 for U.S. Appl. No. 13/850,251, 22 pgs.
Nguyen, Niki Hoang, Office Action received from the USPTO dated Apr. 2, 2014 for U.S. Appl. No. 13/850,251, 9 pgs.
Nguyen, Niki Hoang, Final Office Action received from the USPTO dated Jan. 22, 2015 for U.S. Appl. No. 13/850,251, 245 pgs.
Nguyen, Niki Hoang, Notice of Allowance received from the USPTO dated Apr. 22, 2015 for U.S. Appl. No. 13/850,251, 22 pgs.
Brindle, et al., Preliminary Amendment filed in the USPTO dated Jul. 19, 2013 for U.S. Appl. No. 13/850,251, 21 pgs.
Scheinberg, et al., "A Computer Simulation Model for Simulating Distortion in FET Resistors", IEEE Transactions on Computer-Aided Design of Integrated Circuits and Systems, vol. 19, No. 9, Sep. 2000, pp. 981-989.
Streetman, et al., "Solid State Electronic Devices", Microelectronics Research Center, Dept. of Electrical and Computer Engineering, The University of Texas at Austin, Chapter 6, 2004 by Pearson Education Inc., 4 pgs.
Tokumitsu, et al, "A Low-Voltage, High-Power T/R-Switch MMIC Using LC Resonators", IEEE Transactions on Microwave Theory and Techniques, vol. 43, No. 5, May 1995, pp. 997-1003.
Adan, et al., "OFF-State Leakage Current Mechanisms in BulkSi and SOI MOSFETs and Their Impact on CMOS ULSIs Standby Current", IEEE Transactions on Electron Devices, vol. 48, No. 9, Sep. 2001, pp. 2050-2057.
Chan, et al., "A Novel SOI CBiCMOS Compatible Device Structure for Analog and Mixed-Mode Circuits", Dept. of EECS, University of California at Berkeley, IEEE 1995, pp. 40-43.
Street, A.M., "RF Switch Design", The Institution of Electrical Engineers, 2000, pp. 4/1-4/7.
Adan, et al., "Linearity and Low-Noise Performance of SOI MOSFETs for RF Applications", IEEE Transactions on Electron Devices, vol. 49, No. 5, May 2002, pp. 881-888.
Cristoloveanu, et al., "The Four-Gate Transistor", Institute of Microelectronics, Electromagnetism and Photonics, ESSDERC 2001, pp. 323-326.
Ayasli, et al., "An X-Band 10 W Monolithic Transmit-Receive GaAs FET Switch", Raytheon Research Division, 1982 IEEE, pp. 42-46.
Analog Devices, "LC2MOS High Speed, Quad SPST Switch", Rev. B, 8 pgs.
Dufrene, et al., "The G4-FET: Low Voltage to High Voltage Operation and Performance", Dept. of Electrical and Computer Engineering, The University of Tennessee, IEEE 2003, pp. 55-56.
Pucel, et al., "A Multi-Chip GaAs Monolithic Transmit/Receive Module for X-Band", Research Division, Raytheon Company, 1982 IEEE MTT-S Digest, pp. 489-492.
Analog Devices, "LC2MOS Quad SPST Switches", Rev. B, 6 pgs.
Dufrene, et al., "Investigation of the Four-Gate Action in G4-FETs", IEEE Transactions on Electron Devices, vol. 51, No. 11, Nov. 2004, pp. 1931-1935.
Ayasli, et al., "A Monolithic Single-Chip X-Band Four-Bit Phase Shifter", IEEE Transactions on Microwave Theory and Techniques, vol. MTT-30, No. 12, Dec. 1982, pp. 2201-2206.
Akarvardar, et al., "Multi-Bias Dependence of Threshold Voltage, Subthreshold Swing, and Mobility in G4-FETs", Institute of Microelectronics, Electromagnetism, and Photonics, IEEE 2003, pp. 127-130.
Lim, et al., "Partial SOI LDMOSFETs for High-Side Switching", Dept. of Engineering, University of Cambridge, 1999 IEEE, pp. 149-152.
Akarvardar, et al., "Threshold Voltage Model of the SOI 4-Gate Transistor", 2004 IEEE International SOI Conference, Oct. 2004, pp. 89-90.
Allen, Thomas P., "Characterization and Modeling of Silicon-on-Insulator Field Effect Transistors", Department of Electrical Engineering and Computer Science, MIT, May 20, 1999, 80 pgs.
Fung, et al., "Frequency Dispersion in Partially Depleted SOI MOSFET Output Resistance", Proceedings 1996 IEEE International SOI Conference, Oct. 1996, pp. 146-147.
Chen, Suheng, "G4-FET Based Voltage Reference", Masters Theses, University of Tennessee, Knoxville, Trace: Tennessee Research and Creative Exchange, May 2004, 57 pgs.
Zhu, et al., "Simulation of Suppression of Floating-Body Effect in Partially Depleted SOI MOSFET Using a Si1-xGex Dual Source Structure", Materials Science and Engineering B 114-115 (2004), pp. 264-268.
Hieda, et al., Floating-Body Effect Free Concave SOI-MOSFETs (COSMOS), ULSI Research Center, Toshiba Corporation, IEEE 1991, pp. 26.2.1-26.2.4.
Ming, et al., "A New Structure of Silicon-on-Insulator Metal-Oxide-Semiconductor Field Effect Transistor to Suppress the Floating Body Effect", Chin. Phys. Lett., vol. 20, No. 5 (2003), pp. 767-769.
Marks, Jeffery Earl, "SOI for Frequency Synthesis in RF Integrated Circuits", Thesis submitted to North Carolina State University, 2003, 155 pgs.
Moye, et al., "A Compact Broadband, Six-Bit MMIC Phasor with Integrated Digital Driversi+", IEEE 1990 Microwave and Millimeter-Wave Monolithic Circuits Symposium, 1988 IEEE, pp. 123-126.
Smuk, et al., "Monolithic GaAs Multi-Throw Switches with Integrated Low-Power Decoder-Driver Logic", Hittite Microwave Corporation, Jun. 1997, 4 pgs.
Wei, et al., "Large-Signal Model of Triple-Gate MESFET/PHEMT for Switch Applications", Alpha Industries, Inc., 1999 IEEE, pp. 745-748.
Soyuer, et al., "RF and Microwave Building Blocks in a Standard BiCMOS Technology", IBM T.J. Watson Research Center, 1996 IEEE, pp. 89-92.
Mizutani, et al., "Compact DC-60-GHz HJFET MMIC Switches using Ohmic Electrode-Sharing Technology", IEEE Transactions on Microwave Theory and Techniques, vol. 46, No. 11, Nov. 1998, pp. 1597-1603.
Ota, et al. "High Isolation and Low Insertion Loss Switch IC Using GaAs MESFETs", IEEE Transactions on Microwave Theory and Techniques, vol. 43, No. 9, Sep. 1995, pp. 2175-2177.
Koo, Raymond, "RF Switches", Univ. Toronto, Elec. And Computer Engineering Dept. 2001, 12 pgs.
Titus, et al., "A Silicon BICMOS Transceiver Front-End MMIC Covering 900 and 1900 Mhz Applications", Hittite Microwave Corporation, IEEE 1996 Microwave and Millimeter-Wave Monolithic Circuits Symposium, pp. 73-75.
Rossek, Sacha, "Direct Optical Control of a Microwave Phase Shifter Using GaAs Field-Effect Transistors", Communications

(56) References Cited

OTHER PUBLICATIONS

Research Group, School of Electronic Engineering, Faculty of Technology, Middlesex University, Sep. 1998, 224 pgs.
Schindler, et al., "DC-20 Ghz N X M Passive Switches", Raytheon Co., 1998 IEEE MTT-S Digest, pp. 1001-1005.
Houng, et al., "60-70 dB Isolation 2-19 GHz Switches", Raytheon Electromagnetic Systems Division, 1989 IEEE, GaAs IC Symposium, pp. 173-176.
Schindler, et al., "DC-40 GHz and 20-40 GHz MMIC SPDT Switches", IEEE Transactions of Electron Devices, vol. ED-34, No. 12, Dec. 1987, pp. 2595-2602.
Schindler, et al., "A 2-18 GHz Non-Blocking Active 2×2 Switch", Raytheon Company, 1989 IEEE, GaAs IC Symposium, pp. 181-183.
Schindler, et al., "A Single Chip 2-20 GHz T/R Module" 1988 IEEE, IEEE 1990 Microwave and Millimeter-Wave Monolithic Circuits Symposium, pp. 99-102.
Bernkopf, et al., "A High Power K/Ka-Band Monolithic T/R Switch", 1991 IEEE, IEEE 1991 Microwave and Millimeter-Wave Monolithic Circuits Symposium, pp. 15-18.
Schindler, et al., "DC-20 GHz N X M Passive Switches", IEEE Transactions on Microwave Theory and Techniques, vol. 36, No. 12, Dec. 1988, pp. 1604-1613.
Brindle, et al., Amendment filed in the USPTO dated Dec. 26, 2013 for U.S. Appl. No. 13/850,251, 22 pgs.
Brindle, et al., Amendment filed in the USPTO dated Oct. 2, 2014 for U.S. Appl. No. 13/850,251, 13 pgs.
Brindle, et al., Amendment filed in the USPTO dated Mar. 23, 2015 for U.S. Appl. No. 13/850,251, 14 pgs.
Brindle, et al., "Method and Apparatus for use in Improving Linearity of MOSFETs Using an Accumulated Charge Sink", U.S. Appl. No. 14/845,154, filed Sep. 3, 2015.
Brindle, et al., "Method and Apparatus for use in Improving Linearity of MOSFETs using an Accumulated Charge Sink-Harmonic Wrinkle Reduction", U.S. Appl. No. 14/804,198, filed Jul. 20, 2015.
Fuse, et al., "A 0.5V 200MHz 1-Stage 32b ALU Using a Body Bias Controlled SOI Pass-Gate Logic", IEEE Int'l Solid-State Circuits Conference, Feb. 1997.
Douseki, et al., "A 0.5-V MTCMOS/SIMOX Logic Gate", IEEE Journal of Solid-State Circuits, vol. 32, No. 10, Oct. 1997.
Douseki, et al., "A 0.5v SIMOX-MTMCOS Circuit with 200ps Logic Gate", IEEE Int'l Solid-State Circuits Conference, 1996, pp. 84-85, 423.
Shimomura, et al., "A 1-V 46-ns 16-mb SOI-DRAM with Body Control Technique", IEEE Journal of Solid-State Circuits, vol. 32, No. 11, Nov. 1997, pp. 1712-1720.
Ueda, et al., "A CAD Compatible SOI/CMOS Gate Array Having Body Fixed Partially Depleted Transistors", IEEE Int'l Solid-State Circuits Conference, Feb. 8, 1997, pp. 288-289.
Kuang, et al., "A Dynamic Body Discharge Technique for SOI Circuit Applications", IEEE Int'l SOI Conference, Oct. 1999, pp. 77-78.
Assaderaghi, et al., "A Dynamic Threshold Voltage MOSFET (DTMOS) for Ultra-Low Voltage Operation", Int'l Electron Devices Meeting, Dec. 1994, pp. 809-812.
Gil, et al., "A High Speed and Low Power SOI Inverter Using Active Body-Bias", Proceedings Int'l Symposium on Low Power Electronics and Design, Aug. 1998, pp. 59-63.
Gil, et al., "A High Speed and Low Power SOI Inverter Using Active Body-Bias", Solid-State Electronics, vol. 43, 1999, pp. 791-799.
Kuang, et al., "A High-Performance Body-Charge-Modulated SOI Sense Amplifier", IEEE Int'l SOI Conference, Oct. 2000, pp. 100-101.
Chung, et al., "A New SOI Inverter for Low Power Applications", IEEE SOI Conference, Oct. 1996, pp. 20-21.
Chung, et al., "A New SOI Inverter Using Dynamic Threshold for Low-Power Applications", IEEE Electron Device Letters, vol. 18, No. 6, Jun. 1997, pp. 248-250.

Chung, et al., "A New SOI MOSFET Structure with Junction Type Body Contact", Int'l Electron Device Meeting (IEDM) Technical Digest, 1999, pp. 59-62.
Terauchi, et al., "A Novel 4T SRAM Cell Using "Self-Body-Biased" SOI MOSFET Structure Operating at 0.5 Volt", IEEE Int'l SOI Conference, Oct. 2000, pp. 108-109.
Wang, et alll., "A Novel Low-Voltage Silicon-On-Insulator (SOI) CMOS Complementary Pass-Transistor Logic (CPL) Circuit Using Asymmetrical Dynamic Threshold Pass-Transistor (ADTPT) Technique", Proceedings of the 43rd IEEE Midwest Symposium on Circuits and Systems, Aug. 2000, pp. 694-697.
Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 24-26.
Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 267-270.
Kanda, et al., "A Si RF Switch MMIC for the Cellular Frequency Band Using SOI-CMOS Technology", Institute of Electronics, Information and Communication Engineers Technical Report, vol. 100, No. 152, Jun. 2000, pp. 79-83.
Nakatani, "A Wide Dynamic Range Switched-LNA in SiGe BICMOS", IEEE Radio Frequency Integrated Circuits Symposium, 2001, pp. 223-226.
Tseng, et al., "AC Floating-Body Effects and the Resultant Analog Circuit Issues in Submicron Floating body and Body-Grounded SOI MOSFET's", IEEE Transactions on Electron Devices, vol. 46, No. 8, Aug. 1999, pp. All.
Tseng, et al., "AC Floating-Body Effects in Submicron Fully Depleted (FD) SOI nMOSFET's and the Impact on Analog Applications", IEEE Electron Devices, vol. 19, No. 9, Sep. 1998, pp. 351-353.
Wada, et al., "Active Body-Bias SOI-CMOS Driver Circuits", Symposium on VLSI Circuits Digest of Technical Papers, 1997, pp. 29-30.
Saccamango, et al., "An SOI Floating Body Charge Monitor Technique", IEEE Int'l SOI Conference, Oct. 2000, pp. 88-89.
Dunga, "Analysis of Floating Body Effects in Thin Film SOI MOSFET's Using the GIDL Current Technique", Proceedings of the 8th Int'l Symposium on Physical and Failure Analysis of Integrated Circuits, 2001, pp. 254-257.
Gautier, et al., "Body Charge Related Transient Effects in Floating Body SOI NMOSFETs", IEDM Tech. Digest, 1995, pp. 623-626.
Koh, et al., "Body-Contracted SOI MOSFET Structure and its Application to DRAM", IEEE Transactions on Electron Devices, vol. 45, No. 5, May 1998, pp. 1063-1070.
Koh, et al., "Body-Contacted SOI MOSFET Structure with Fully Bulk CMOS Compatible Layout and Process", IEEE Electron Device Letters, vol. 18, No. 3, Mar. 1997, pp. 102-104.
Tseng, et al., "Characterization of Floating Body and Body-Grounded Thin Film Silicon-on-Insulator MOSFETs for Analog Circuit Applications", PhD. Thesis, UCLA, 1999, pgs. All.
Madihian, et al., "CMOS RF ICs for 900MHz-2.4GHz Band Wireless Communication Networks", IEEE Radio Frequency Integrated Circuits Symposium, 1999, pp. 13-16.
F. Hameau and O. Rozeau, "Radio-Frequency Circuits Integration Using CMOS SOI 0.25μm Technology", 2002 RF IC Design Workshop Europe, Mar. 19-22, 2002, Grenoble, France.
O. Rozeau et al., "SOI Technologies Overview for Low-Power Low-Voltage Radio-Frequency Applications," Analog Integrated Circuits and Signal Processing, 25, pp. 93-114, Boston, MA, Kluwer Academic Publishers, Nov. 2000.
C. Tinella et al., "A High-Performance CMOS-SOI Antenna Switch for the 2.55-GHz Band, "IEEE Journal of Solid-State Circuits, vol. 38, No. 7, Jul. 2003.
H. Lee et al., "Analysis of body bias effect with PD-SOI for analog and RF applications," Solid State Electron., vol. 46, pp. 1169-1176, 2002.
J.-H. Lee, et al., "Effect of Body Structure on Analog Performance of SOI NMOSFETs," Proceedings, 1998 IEEE International SOI Conference, Oct. 5-8, 1998, pp. 61-62.

(56) References Cited

OTHER PUBLICATIONS

C. F. Edwards, et al., The Effect of Body Contact Series Resistance on SOI CMOS Amplifier Stages, IEEE Transactions on Electron Devices, vol. 44, No. 12, Dec. 1997 pp. 2290-2294.

S. Maeda, et al., Substrate-bias Effect and Source-drain Breakdown Characteristics in Body-tied Short-channel SOI MOSFET's, IEEE Transactions on Electron Devices, vol. 46, No. 1, Jan. 1999 pp. 151-158.

F. Assaderaghi, et al., "Dynamic Threshold-voltage MOSFET (DTMOS) for Ultra-low Voltage VLSI," IEEE Transactions on Electron Devices, vol. 44, No. 3, Mar. 1997, pp. 414-422.

G. O. Workman and J. G. Fossum, "A Comparative Analysis of the Dynamic Behavior of BTG/SOI MOSFETs and Circuits with Distributed Body Resistance," IEEE Transactions on Electron Devices, vol. 45, No. 10, Oct. 1998 pp. 2138-2145.

T.-S. Chao, et al., "High-voltage and High-temperature Applications of DTMOS with Reverse Schottky Barrier on Substrate Contacts," IEEE Electron Device Letters, vol. 25, No. 2, Feb. 2004, pp. 86-88.

Wei, et al., "Measurement of Transient Effects in SOI DRAM/SRAM Access Transistors", IEEE Electron Device Letters, vol. 17, No. 5, May 1996.

Kuang, et al., "SRAM Bitline Circuits on PD SOI: Advantages and Concerns", IEEE Journal of Solid-State Circuits, vol. 32, No. 6, Jun. 1997.

Sleight, et al., "Transient Measurements of SOI Body Contact Effectiveness", IEEE Electron Device Letters, vol. 19, No. 12, Dec. 1998.

Chung, et al., "SOI MOSFET Structure with a Junction-Type Body Contact for Suppression of Pass Gate Leakage", IEEE Transactions on Electron Devices, vol. 48, No. 7, Jul. 2001.

Lee, et al., "Effects of Gate Structures on the RF Performance in PD SOI MOSFETs", IEEE Microwave and Wireless Components Letters, vol. 15, No. 4, Apr. 2005.

Hirano, et al., "Impact of Actively Body-bias Controlled (ABC) SOI SRAM by using Direct Body Contact Technology for Low-Voltage Application" IEEE, 2003, pp. 2.41-2.4.4.

Lee, et al., "Harmonic Distortion Due to Narrow Width Effects in Deep sub-micron SOI-CMOS Device for analog-RF Applications", 2002 IEEE International SOI Conference, Oct. 2002.

Orndorff, et al., "CMOS/SOS/LSI Switching Regulator Control Device", ISSCC 78, Feb. 17, 1978, IEEE International Solid-State Circuits Conference, pp. 234-235 and 282.

Kuo, et al., "Low-Voltage SOI CMOS VLSI Devices and Circuits", 2001, Wiley Interscience, New York, XP001090589, pp. 57-60 and 349-354.

Tat, Binh C., International Search Report and Written Opinion received from USRO dated Jul. 3, 2008 for application No. PCT/US06/36240, 10 pgs.

Tat, Binh C., Office Action received from USPTO dated Sep. 15, 2008 for U.S. Appl. No. 11/520,912, 18 pgs.

Shingleton, Michael B., Office Action dated Oct. 7, 2008 received from the USPTO for U.S. Appl. No. 11/881,816, 4 pgs.

Hoffmann, Niels, Communication from the EPO dated Feb. 4, 2009 for appln No. 06786943.8, 7 pgs.

Stuber, Michael, et al., photocopy of an Amendment dated Mar. 16, 2009 filed in the USPTO for U.S. Appl. No. 11/520,912, 21 pages.

Shingleton, Michael B., Communication received from USPTO dated Apr. 28, 2009 for U.S. Appl. No. 11/881,816, 3 pgs.

Tat, Binh C., Office Action received from USPTO dated Jul. 8, 2009 for U.S. Appl. No. 11/520,912, 6 pgs.

Dribinsky, et al, Response filed in USPTO dated Aug. 28, 2009 for U.S. Appl. No. 11/881,816, 5 pgs.

Photocopy of a translation of an Office Action dated Jul. 31, 2009 for Chinese appln. No. 200680025128.7, 3 pages.

Stuber, Michael, et al., Photocopy of a Response that was filed in the UPSTO for U.S. Appl. No. 11/520,912, dated Sep. 8, 2009, 3 pgs.

Tat, Binh C., Office Action received from the USPTO dated Dec. 10, 2009 for U.S. Appl. No. 11/520,912, 19 pages.

Shingleton, Michael B., Office Action received from the USPTO dated Jan. 19, 2010 for U.S. Appl. No. 11/881,816, 16 pgs.

Brindle, Chris, et al., Translation of a Response filed in the Chinese Patent Office for appln No. 200680025128.7 dated Nov. 30, 2009, 3 pages.

Morena, Enrico, Supplementary European Search Report for appln. No. 06814836.0, dated Feb. 17, 2010, 8 pages.

Kuang, J.B., et al., "A Floating-Body Charge Monitoring Technique for Partially Depleted SOI Technology", Int. J. of Electronics, vol. 91, No. 11, Nov. 11, 2004, pp. 625-637.

Stuber, et al., Amendment filed in the USPTO for U.S. Appl. No. 11/520,912, dated Jun. 10, 2010, 25 pages.

Sedra, Adel A., et al., "Microelectronic Circuits", Fourth Edition, University of Toronto, Oxford University Press, 1982, 1987, 1991 and 1998, pp. 374-375.

Tat, Binh C., Notice of Allowance received from the USPTO for U.S. Appl. No. 11/520,912, dated Sep. 16, 2010, 13 pages.

Brindle, et al., Response filed in the EPO for application No. 06 814 836.0-1235 dated Oct. 12, 2010, 24 pages.

Nguyen, Tram Hoang, Office Action received from the USPTO dated Sep. 19, 2008 for U.S. Appl. No. 11/484,370, 7 pgs.

Brindle, et al., Response filed in the USPTO dated Jan. 20, 2009 for U.S. Appl. No. 11/484,370, 5 pgs.

Nguyen, Tram Hoang, Office Action received from the USPTO dated Apr. 23, 2009 for U.S. Appl. No. 11/484,370, 11 pgs.

Brindle, et al., Response filed in the USPTO dated Aug. 24, 2009 for U.S. Appl. No. 11/484,370, 5 pgs.

Nguyen, Tram Hoang, Office Action received from the USPTO dated Jan. 6, 2010 for U.S. Appl. No. 11/484,370, 46 pgs.

Brindle, et al., Amendment filed in the USPTO dated Jul. 6, 2010 for U.S. Appl. No. 11/484,370, 23 pgs.

Bolam, et al., "Reliability Issues for Silicon-on-Insulator", 2000 IEEE, IBM Microelectronics Division, pp. 6.4.1-6.4.4, 4 pgs.

Hu, et al., "A Unified Gate Oxide Reliability Model", IEEE 99CH36296, 37th Annual International Reliability Physics Symposium, San Diego, CA 1999, pp. 47-51.

Pozar, "Microwave and RF Design of Wireless Systems", Wiley, 2001.

Maas, "The RF and Microwave Circuit Design Cookbook", Artech House, 1998.

Smith, "Modern Communication Systems", McGraw-Hill, 1998.

Van Der Pujie, "Telecommunication Circuit Design", Wiley, 2002.

Razavi, "RF Microelectronics", Prentice-Hall, 1998.

Van Der Pujie, "Telecommunication Circuit Design", Wiley, 1992.

Weisman, "The Essential Guide to RF and Wireless", Prentice-Hall, 2000.

Wetzel, "Silicon-on-Sapphire Technology for Microwave Power Application", University of California, San Diego, 2001.

Johnson, "Silicon-on-Sapphire Technology for Microwave Circuit Applications", Dissertation, UCSD, 1997, pp. 1-184.

Minoli, "Telecommunications Technology Handbook", Artech House, 2003.

Morreale, "The CRC Handbook of Modern Telecommunication", CRC Press, 2001.

Sayre, "Complete Wireless Design", McGraw-Hill, 2001.

Schaper, "Communications, Computations, Control, and Signal Processing", Kluwer Academic, 1997.

Shafi, "Wireless Communications in the 21st Century", Wiley, 2002.

Willert-Porata, M, Advanced in Microwave and Radio Frequency Processing, 8th International Conference on Microwave and High-Frequency Heating, Oct. 2009.

Itoh, Tadashige, et al., English Translation of Office Action received from the JPO dated Dec. 1, 2015 for appln. No. 2013-535054, 3 pgs.

Nguyen, Niki Hoang, Office Action received from the USPTO dated Mar. 2, 2016 for U.S. Appln. No. 14/804,198, 5 pgs.

Tat, Binh, Final Office Action received from the USPTO dated Nov. 19, 2015 for U.S. Appl. No. 13/948,094, 34 p gs.

Hoffmann, Niels, Communication pursuant to Article 94(3) EPC received from the EPO dated May 13, 2016 for appln. No. 11153313.9, 4 pgs.

Peregrine Semiconductor Corporation, Response filed in the EPO dated Mar. 30, 2016 for appln. No. 11153247.9, 13 pgs.

Peregrine Semiconductor Corporation, Response filed in the EPO dated Mar. 30, 2016 for appln. No. 11153241.2, 13 pgs.

(56) References Cited

OTHER PUBLICATIONS

Peregrine Semiconductor Corporation, Response filed in the EPO dated Mar. 30, 2016 for appln. No. 11153281.1, 13 pgs.
Peregrine Semiconductor Corporation, Reply to Summons to Attend Oral Proceedings filed in the EPO dated Apr. 15, 2016 for appln. No. 06786943.8, 16 pgs.
Brindle, et al., Response filed in the USPTO dated Jun. 2116 for U.S. Appl. No. 14/804,198, 9 pgs.
Nguyen, Niki Hoang, Office Action received from the USPTO dated Jun. 1, 2016 for U.S. Appl. No. 14/845,154, 6 pgs.
Peregrine Semiconductor Corporation, Response filed in the EPO dated Sep. 6, 2016 for appln. No. 16020116.6, 2 pgs.
Nguyen, Niki Hoang, Notice of Allowance received from the USPTO dated Sep. 23, 2016 for U.S. Appl. No. 14/804,198, 21 pgs.
Tieu, Binh Kien, Office Action received from the UPSTO dated Oct. 4, 2016 for U.S Appl. No. 14/883,499, 23 pgs.
Brindle, et al., Response filed in the USPTO dated Oct. 28, 2016 for U.S. Appl. No. 14/845,154, 9 pgs.
Eliasson, et al., Decision of Technical Board of Appeal 3.4.03 of Sep. 29, 2016 received from the EPO dated Sep. 29, 2016 for application No. 06786943.8, 15 pgs.
Sanchez, Chiquero, Minutes of the oral proceedings received from the EPO dated Oct. 10, 2016 for application No. 36786943.8, 35 pgs.
Hoffmann, et al., Communication under Rule 71(3) EPC received from the EPO dated Dec. 1, 2016 for appln. No. 06786943.8, 4 pgs.

\* cited by examiner

SEMICONDUCTOR DEVICES WITH SWITCHABLE GROUND-BODY CONNECTION

BACKGROUND

1. Field

The present disclosure relates to semiconductor devices. More particularly, the present disclosure relates to semiconductor devices with switchable ground-body connection.

2. Description of Related Art

Floating body N-channel metal oxide semiconductor (NMOS) devices, whose device bodies float relative to ground, can exhibit higher power added efficiency (PAE) than body tied NMOS devices, whose device bodies are connected (or tied) to ground or a reference potential close to ground, by way of a body tie. However, floating body NMOS devices can also exhibit leakage current that is orders of magnitude worse than body tied NMOS devices.

U.S. Pat. No. 7,910,993 B2, issued on Mar. 22, 2011 which is related to the present disclosure is incorporated by reference herein in its entirety.

SUMMARY

According to a first aspect of the present disclosure, a semiconductor device is provided, the semiconductor device comprising: a transistor that is fabricated on a substrate, the transistor having a body; and a switch with a first switch terminal connected to the body and a second switch terminal connected to a reference potential node, the switch configured to be controlled by a control signal to provide a first operating characteristic in the transistor by connecting the body to the reference potential node and to provide a second operating characteristic in the transistor by disconnecting the body from the reference potential node.

According to a second aspect of the present disclosure, a semiconductor device is provided, the semiconductor device comprising: a stacked arrangement of transistors that is fabricated on a substrate, each transistor of the stacked arrangement having a body and one or more switches in correspondence of one or more transistors from the stacked arrangement of transistors, each with a first switch terminal connected to the body of a corresponding transistor from the one or more transistors, and a second switch terminal connected to a corresponding reference potential node, the one or more switches configured to be controlled by a control signal to provide a first operating characteristic in the corresponding transistor by connecting the body of the corresponding transistor to the corresponding reference potential node and to provide a second operating characteristic in the corresponding transistor by disconnecting the body from the reference potential node.

According to a third aspect of the present disclosure, a method of operating a transistor is provided, the method comprising: coupling a body of the transistor to a reference potential node when no input signal is provided to the transistor; and decoupling the body from the reference potential node when a radio frequency (RF) signal is provided to the transistor.

According to a fourth aspect of the present disclosure, a method of operating a transistor is provided, the method comprising: fabricating a transistor on a substrate, the transistor having a body; and fabricating a switch on the substrate with a first switch terminal of the switch connected to the body and a second switch terminal of the switch connected to a reference potential node.

According to a fifth aspect of the present disclosure, a method of operating a transistor is provided, the method comprising: coupling a body of one or more transistors from the stacked arrangement of transistors to a corresponding reference potential node when no input signal is provided to an input transistor of the stacked arrangement; and decoupling the body of the one or more transistors from the corresponding reference node when a radio frequency (RF) signal is provided to the input transistor, wherein the one or more transistors comprises the input transistor.

According to a sixth aspect of the present disclosure, a method of fabricating a semiconductor device is provided, the method comprising: fabricating a stacked arrangement of one or more transistors on a substrate, each of the one or more transistors having a body; and fabricating one or more switches on the substrate in correspondence of the one or more transistors with a first switch terminal of each of the one or more switches connected to the body of a corresponding transistor and a second switch terminal of each of the one or more switches connected to a corresponding reference potential node.

Further embodiments are provided in the specification, drawings, and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure. Like reference numerals indicate corresponding parts in the various figures.

DETAILED DESCRIPTION

Figure 1A:
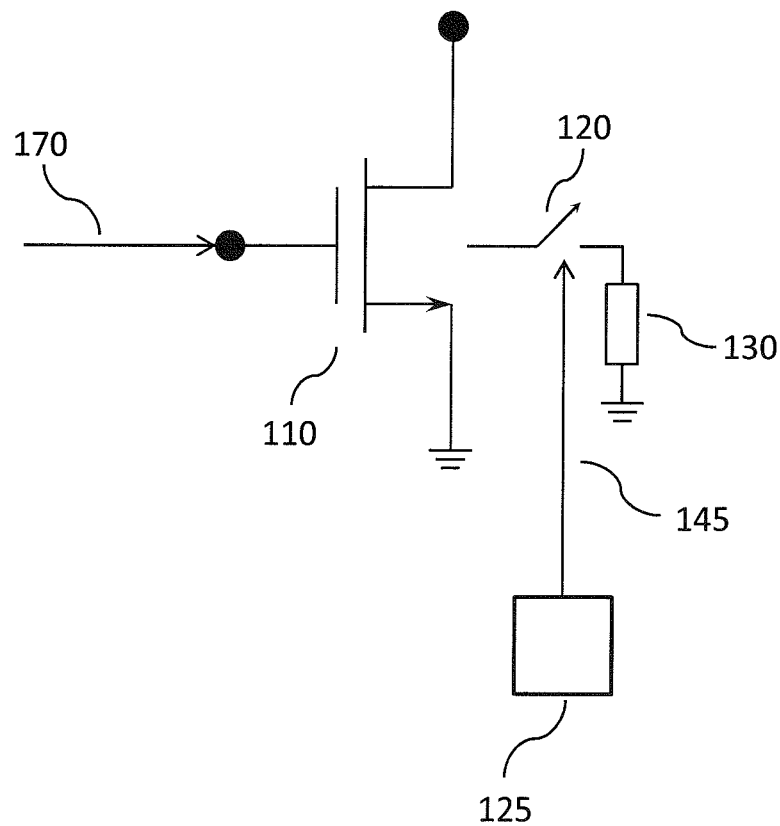
FIG. 1A shows an NMOS device in accordance with an embodiment of the present disclosure. The NMOS device can be constructed with a switch that allows a body terminal of the device to be selectively connected to a reference potential (e.g. ground) or disconnected from the reference potential (e.g. ground), depending on absence or presence of an RF signal, where the switch can be controlled by baseband/transceiver circuitry that is providing RF input.

As used in the present disclosure, the term "body" can refer to a portion of a device between source and drain beneath a conducting channel. The preceding definition applies to both silicon on insulator devices as well as bulk CMOS devices because the portion referred to by the preceding definition describes a portion of a bulk CMOS device that can be considered as both the body and substrate of the bulk CMOS device (e.g. the body and substrate of a bulk CMOS device are generally the same).

As used in the present disclosure, the term "substrate" can refer to an insulating wafer upon which a semiconductor device or devices can be fabricated for the case of silicon on insulator devices. Alternatively, for bulk devices, the term "substrate" may refer to a silicon wafer upon which devices can be fabricated.

As used in the present disclosure, the term "floating body device" can refer to a device whose body floats relative to ground. Examples of devices that can have a floating body configuration include, but are not limited to, "floating body NMOS devices" as well as "floating body PMOS devices".

As used in the present disclosure, the term "body tied device" can refer to a device whose body is connected (or tied) to a reference potential such as ground. Examples of devices that can have a body tied configuration include, but are not limited to, "body tied NMOS devices" as well as "body tied PMOS devices".

As used in the present disclosure, the term "efficiency" can refer to a measure of how well a device converts one energy source to another. In a case of an NMOS device configured as a power amplifier and operating at radio frequencies (RF), efficiency of the NMOS device is a metric that quantifies conversion of direct current (DC) power that is input to a drain of the NMOS device to RF power that is output from the drain of the NMOS device. Such efficiency may also be referred to as drain efficiency of the NMOS device. Power added efficiency (PAE) provides a metric of efficiency that takes into consideration that gain of the power amplifier is not infinite.

As used in the present disclosure, the term "channel" can refer to a frequency range. More in particular, the term "channel" as used herein can refer to a frequency range defined by a wireless standard such as, but not limited to, wideband code division multiple access (WCDMA) and long term evolution (LTE). Based on the preceding definition of "channel", adjacent channel leakage ratio (ACLR) provides a ratio of adjacent channel power to main channel power. For instance, in WCDMA, a channel bandwidth is 5 MHz. Consider power is to be transmitted on/within a main channel of 1925 MHz to 1930 MHz. Adjacent channels would encompass the 5 MHz below the main channel (i.e. 1920 MHz to 1925 MHz) and the 5 MHz above the main channel (i.e. 1930 MHz to 1935 MHz), and the ACLR will be ratio of power leaked into these adjacent channels to power in the main channel. Consequently, the ACLR can be utilized as a measure of linearity of a device since higher ACLR is associated with more frequency smearing (lower linearity).

As used in the present disclosure, the term "operating characteristic" can refer to value of a metric utilized to measure performance of a device (e.g. a transistor). Metrics of the device include measures of efficiency, linearity, and leakage, and others identifiable by a person skilled in the art. Operating characteristics of the device would encompass values of these metrics.

As used in the present disclosure, the "presence" or "absence" of a signal is relative to a threshold value that can be set based on application. Specifically, if a signal that is detected is above the threshold value (e.g. detected signal is of sufficient amplitude), then the signal is considered to be "present". Similarly, if a signal that is detected is below the threshold value (e.g. detected signal is not of sufficient amplitude), then the signal is considered to be "absent" or "not present".

It is noted that several embodiments of the present disclosure are described with reference to utilization of NMOS devices. However, reference to NMOS devices is for convenience of discussion only and the embodiments of the present disclosure can also apply to other types of transistors such as PMOS devices. Choice of whether to employ NMOS and PMOS devices is based on considerations that would be known by a person skilled in the art. For example, in RF amplifiers, NMOS devices are generally used since mobility of electrons is higher than mobility of holes. The devices may be constructed using technologies such as, but not limited to, silicon on insulator (SOI) technology, silicon on sapphire (SOS) technology, or bulk complementary metal oxide semiconductor (CMOS) technology.

Various embodiments of the present disclosure can be implemented through NMOS and/or PMOS devices of all thresholds. An exemplary semiconductor process can include one or more of the following types of MOS field effect transistor (FET) types. Example NMOSFETs include regular N (RN) FETs that have a nominal threshold voltage of 450 mV, high doping N (HN) FETs that have a nominal threshold voltage of 700 mV, and intrinsic N (IN) FETs that may have a threshold voltage of approximately 0V. Corresponding PMOSFETs include regular P FETs (RP) that have a nominal threshold voltage of −400 mV, high doping FETs (HP) that have a nominal threshold voltage of −600 mV, and intrinsic P (IP) FETs that may have a threshold voltage of approximately 0 V. In another semiconductor process, HN, RN, HP, and RP FETs may have threshold voltages of 800 mV, 300 mV, −800 mV, and −300 mV, respectively. Details in a circuit are specific to a particular semiconductor process utilized, but the skilled person can adjust details to fit different semiconductor processes.

According to several embodiments of the present disclosure, a semiconductor device, such as an amplifier comprising stacked transistors, can be constructed that comprises one or more transistors and one or more switches. Each transistor within the stack is fabricated on a substrate and has a body whereas a corresponding switch can be configured to either connect the body of the transistor to a reference potential (e.g. ground) node or disconnect the body of the transistor from the reference potential (e.g. ground) node. Although the semiconductor device is discussed with reference to application primarily at RF, teachings of the present disclosure can be applied to operation of the semiconductor device at other frequencies.

Configuration of the switch for each of the transistors, either connecting body to a reference potential or disconnecting body from the reference potential, is generally dependent on operating characteristics desired in the transistor. For example, an application within which the semiconductor device is to be employed may require that the transistor be capable of exhibiting a first operating characteristic (e.g. a particular value or a range of values for PAE of the transistor) when the switch connects the body of the transistor to a reference potential (e.g. ground) and of exhibiting a second operating characteristic (e.g. a particular value or a range of values for loss due to leakage for the transistor) when the switch disconnects the body of the transistor from the reference potential. The first and second operating characteristics may be of different metrics, as in the preceding example, or of the same metric but at different values.

FIG. 1A shows an NMOS device (110) in accordance with an embodiment of the present disclosure. The NMOS device (110) can be constructed with a switch (120) that allows a body of the device (110) to be selectively connected to a reference potential, in this case ground, or disconnected from ground, depending on absence or presence of a primary RF signal (170), where the switch (120) can be controlled by baseband/transceiver circuitry (not shown) that is providing the primary RF signal (170). More specifically, a body tie switch control portion (125) of the transceiver circuitry can send a control signal (145) to the switch (120) to provide appropriate control.

When the transceiver circuitry of a system that comprises the NMOS device (110) is transmitting, the control signal (145) can be a switch de-activation signal configured to open the switch (120) and thereby disconnect the body of the NMOS device (110) from ground. As will be discussed, disconnecting the body of the NMOS device (110) from ground can improve PAE. When the transceiver circuitry of the system is not transmitting, the control signal (145) can be a switch activation signal configured to close the switch (120) and thereby connect the body of the device (110) to ground. As will be discussed, connecting the body of the device (110) to ground or a reference potential close to ground, can reduce leakage current. It is noted that the body tie switch control portion (125) of the transceiver circuitry can be an enable/disable signal generated by the transceiver circuitry and applied to the switch (120) to effect appropriate control depending on whether or not the transceiver circuitry is transmitting.

The switch (120) can be implemented as any one of an NMOS switching transistor, PMOS switching transistor, a diode, or other active device that can be envisioned by a person skilled in the art. Additionally, this embodiment may comprise an impedance element (130)

Figure 1B:
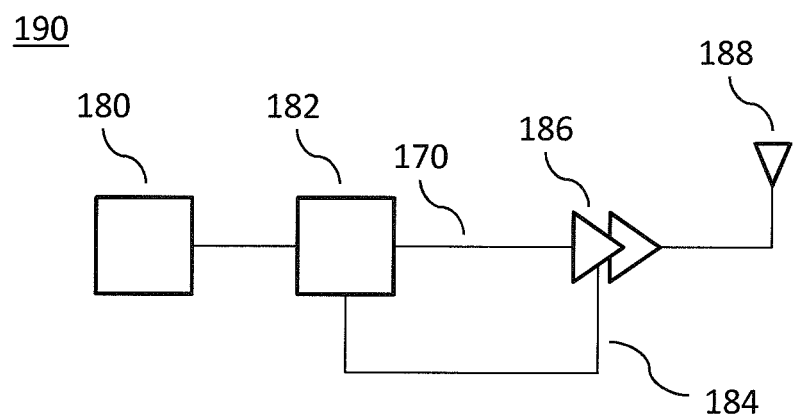
FIG. 1B shows an exemplary system that utilizes the NMOS device of FIG. 1A as a power amplifier.

FIG. 1B shows an exemplary system (190) that utilizes the NMOS device (110) of FIG. 1A as a power amplifier. Specifically, the system (190) may be an RF lineup that comprises a baseband processor (180) that is configured to generate a baseband signal; a transceiver circuit (182) that is configured to receive the baseband signal and upconvert the baseband signal to an RF signal (170); a power amplifier (186) that is configured to receive the RF signal (170); and an antenna (188) that is configured to transmit an output of the power amplifier (186).

Figure 5:
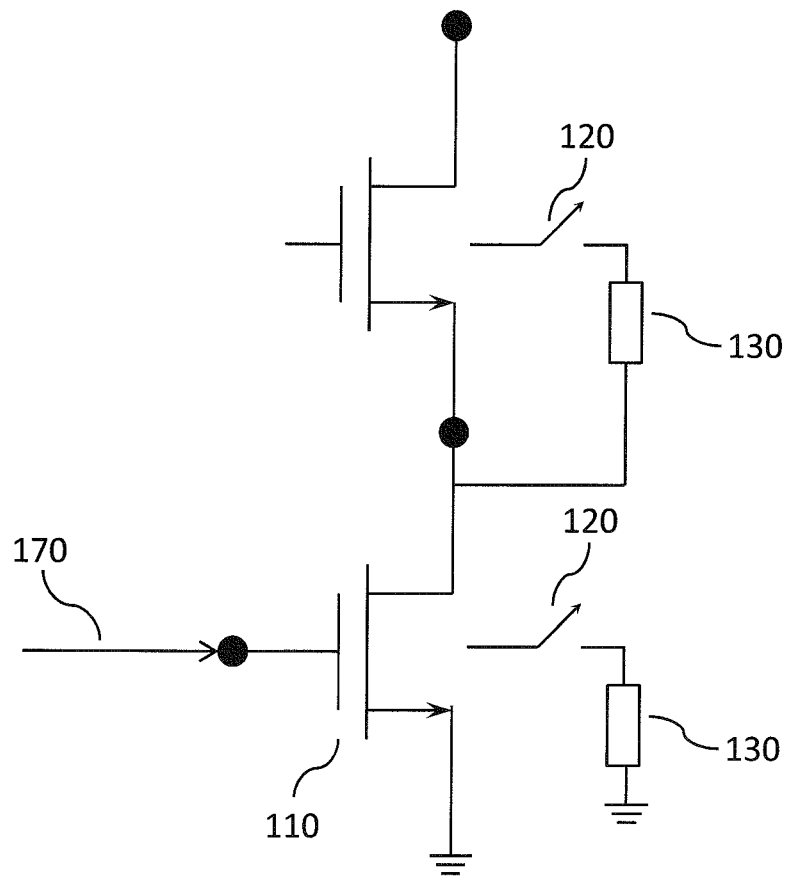
FIG. 5 shows an exemplary embodiment of the present disclosure wherein instead of the single NMOS device of FIG 1A, a stacked arrangement of NMOS devices (e.g. two devices) is used. In this embodiment, each of the NMOS devices may be constructed with a switch that allows the body terminal of the device to be selectively connected to a reference potential depending on the presence or absence of an RF signal at an input node of the stacked arrangement. In the embodiment of FIG. 5, the reference potential for the top device is the source node of the same device, and the reference potential for the bottom (input) device is ground.
Figure 6:
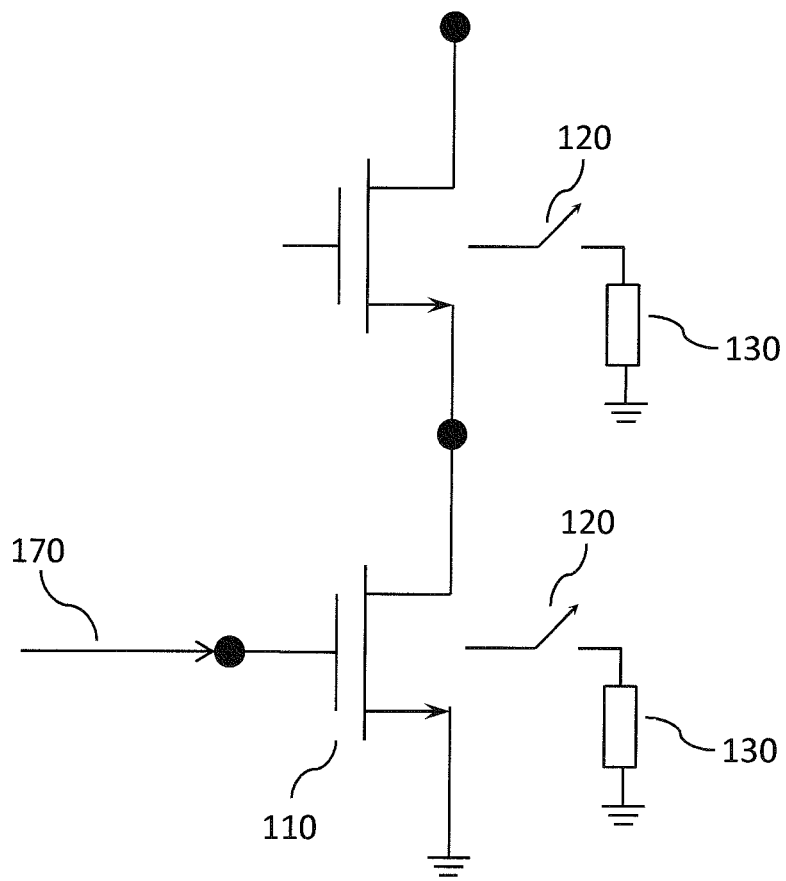
FIG. 6 shows an alternate embodiment of the one presented in FIG. 5, wherein the bodies of all devices within the stacked arrangement are selectively connected the same reference potential (e.g. ground).
Figure 7:
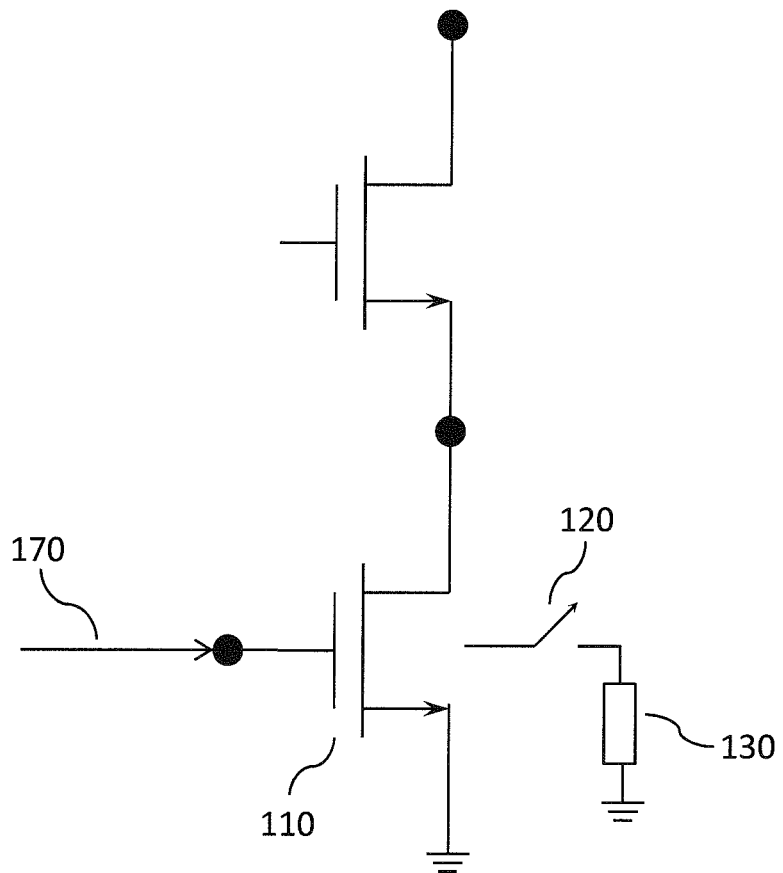
FIG. 7 shows an alternate embodiment of the one presented in FIG. 5, wherein only one of the devices from the stacked arrangement (input device) is provided with a switch to selectively connect the body of the device to a reference potential (e.g. ground).

In FIG. 1B, the power amplifier (186) may be implemented as the NMOS device (110) constructed with a switch (120), as shown in FIG. 1A, or implemented using a stacked arrangement of NMOS devices each with an associated switch as per FIGS. 5-7. In such a case, the transceiver circuit (182) can be further configured to provide a control signal (184) to the NMOS device (110). In particular, the control signal (184) can be provided to the switch (120) as well as the switches associated to the other devices from the stack, to allow a body terminal of the NMOS device (110) and each of the NMOS devices of the stack associated with a switch, to be selectively connected to a reference potential (e.g. ground) or disconnected from the reference potential based on value of the control signal (184). For example, when the power amplifier (186) is being turned off (e.g. configured not to generate RF power), the control signal (184) can be configured to (e.g. set to a value that can) close the switch (120). When the power amplifier (186) is being turned on (e.g. configured to generate RF power), the control signal (184) can open the switch (120). In other words, the power amplifier (186) can be configured to receive a control signal (184) and logic used to open or close the switch (120) can be derived from the control signal (184). It is noted that, although in the example above the control signal (184) is being provided by the transceiver circuit (182), other components, such as the baseband processor (180), can instead provide the control signal (184).

Figure 2A:
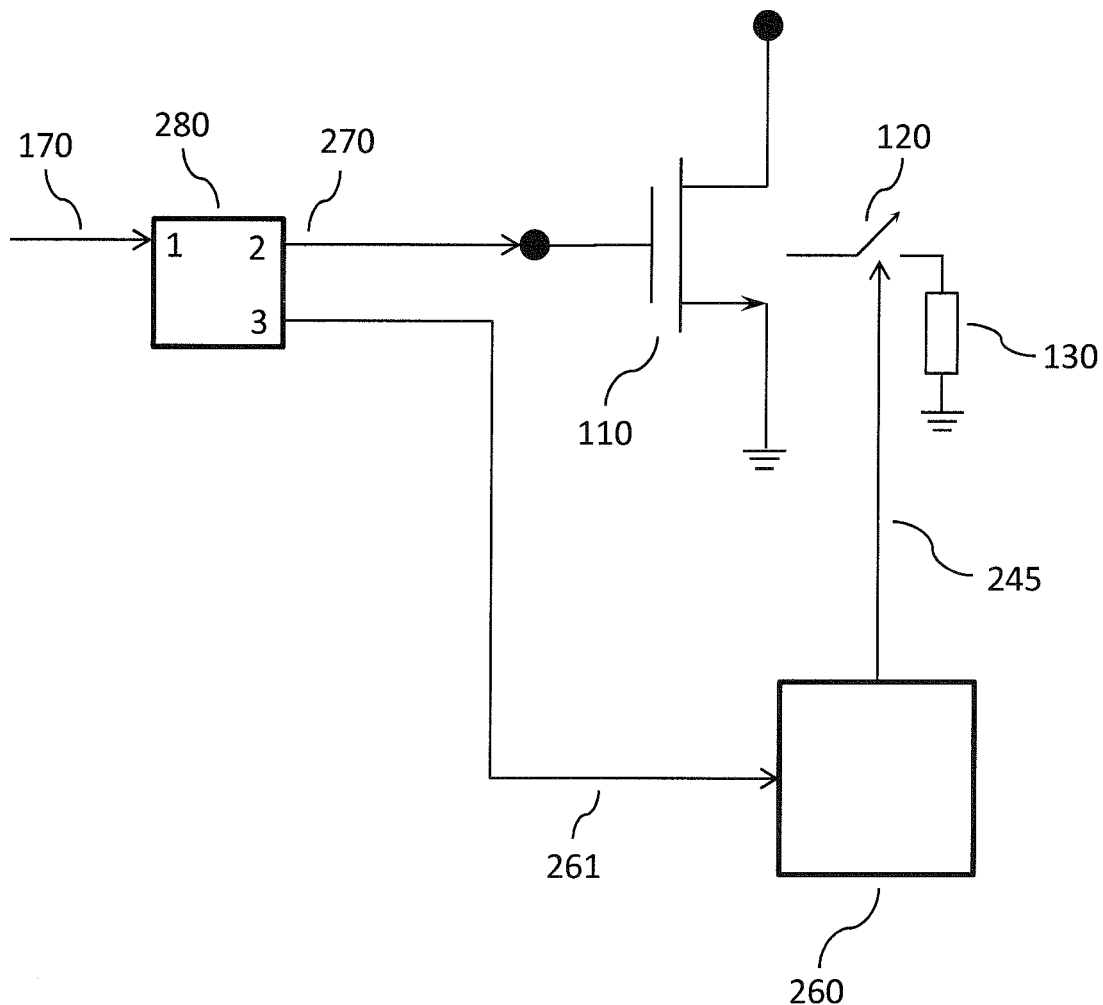
FIGS. 2A and 2B show NMOS devices in accordance with embodiments of the present disclosure. The NMOS devices can be constructed with a switch that allows a body terminal of the devices to be selectively connected to a reference potential (e.g. ground) or disconnected from the reference potential, depending on absence or presence of an RF signal. An RF signal can be detected using an RF coupler, as shown in FIG. 2A, or using an RF detector coupled to one or more of the device terminals, as shown in FIG. 2B.
Figure 2B:
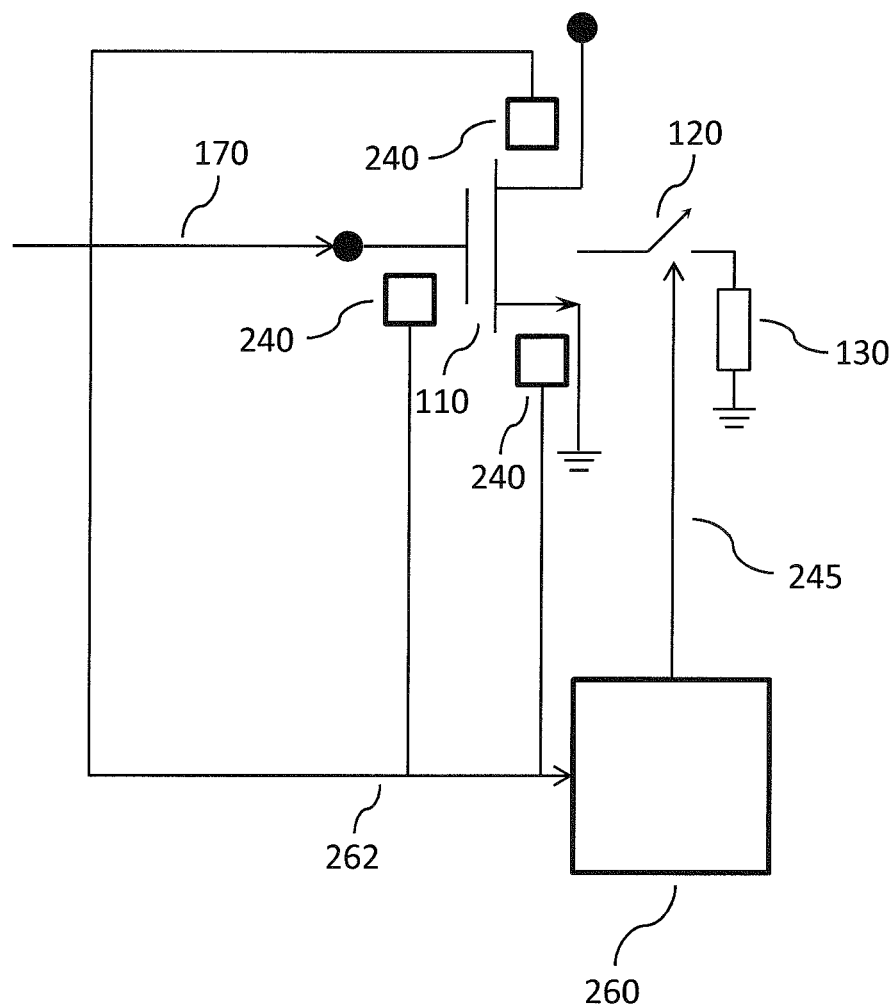

FIGS. 2A and 2B show NMOS devices (110) in accordance with embodiments of the present disclosure. The NMOS devices (110) can be constructed with a switch (120) that allows a body of the device (110) to be selectively connected to a reference potential, in this case ground, or disconnected from ground, depending on absence or presence of an RF signal (261, 262). With reference to FIG. 2A, an RF signal (261) can be detected using an RF coupler (280). With reference to FIG. 2B, an RF signal (262) can be detected using an RF detector (240) coupled to one or more terminals of the NMOS device (110). Any of the embodiments shown in FIGS. 2A and 2B can detect an RF signal at any one of gate, drain, and source of the device (110). The device (110) in FIGS. 1 and 2A-2B may be constructed using technologies such as, but not limited to, SOI technology, SOS technology, or bulk CMOS technology.

In the embodiment shown in FIG. 2A, the RF coupler (280) is a three port RF coupler (280). However, couplers with more ports may also be used. With reference to the embodiment shown in FIG. 2A, a primary RF signal (170), such as from baseband/transceiver circuitry, is input to port 1 of the RF coupler (280), an output (270) from port 2 of the RF coupler (280) can drive the gate terminal of the NMOS device (110), and an output (261) from port 3 of the RF coupler (280) can be fed to a detector/control circuit (260). The detector/control circuit (260) can generate a control signal based on the output (261) from port 3 of the RF coupler (280) to effect control of switch (120).

The RF coupler (280) can be configured to split the primary RF signal (170) such that a majority of signal power of the primary RF signal (170) is output (270) from port 2 of the RF coupler (280) to drive the gate of the NMOS device (110) while a smaller amount of signal power of the primary RF signal (170) is output (261) from port 3 of the RF coupler (280) to feed into the detector/control circuit (260). By way of example and not of limitation, the RF coupler (280) can be configured to split the primary RF signal (170) such that the output (270) from port 2 of the RF coupler (280) contains 90% of signal power of the primary RF signal (170) and RF signal (261) contains 10% of signal power of the primary RF signal (170). Other designs of RF couplers identifiable by a person skilled in the art may also be utilized with the embodiments of the present disclosure. Furthermore and as previously mentioned, the NMOS device may be replaced with a stacked arrangement of NMOS devices, such as depicted in FIGS. 5-7, found within an amplifier, in which case the RF signal at (270) drives the gate of the input transistor (110) from the stack.

According to several embodiments of the present disclosure, an RF signal can be sampled capacitively or magnetically at one or more terminals (e.g. gate, source, drain) of the NMOS device (110). In the embodiment shown in FIG. 2B, an RF signal can be detected at any one of gate, drain, and source terminals of the NMOS device (110), or an input NMOS device (110) of an amplifier comprising stacked devices as depicted in FIGS. 5-7, using an RF detector coupled to corresponding terminals The RF detection can be performed by electrically sensing voltage or current at one or more of the terminals of the NMOS device (110) and couple the sensed voltage or signal to a detector/control circuit (260). For example, FIG. 2B shows the RF detection performed through capacitive coupling (240) employed at each of the terminals, where the capacitive coupling (240) samples RF signals and couples the sampled RF signals to a detector/control circuit (260). Based on signals coupled or otherwise provided to the detector/control circuit (260), the detector/control circuit (260) can generate a control signal to effect control of switch (120).

According to the embodiment shown in FIG. 2A, the signal (261) represents an RF signal detected by the RF coupler (280). According to the embodiment shown in FIG. 2B, the signal (262) represents an RF signal detected by capacitive coupling (240) employed at terminals of the NMOS device (110). In both embodiments, the detector/control circuit (260) detects an RF signal (261, 262) and generates a control signal (245) based on absence or presence of the detected RF signal (261, 262). The detector/control circuit (260) can be fabricated on the same substrate as the NMOS device (110), although doing so does not necessarily confer benefits in regard to leakage or PAE. However, fabricating the detector/control circuit (260) on the same substrate as the NMOS device (110) may simplify fabrication.

The switch (120), as well as each switch associated to a transistor within the stack as depicted in FIGS. 5-7, can be controlled by the control signal (245). The control signal (245) can be a switch de-activation signal that will open the switches and thereby disconnect the body of each one of the NMOS devices from the corresponding reference potential (e.g. ground). This can result in higher PAE. By way of example, the detector/control circuit (260) can generate the switch de-activation signal if an RF signal (261, 262) of sufficient amplitude is detected in at least one terminal of the NMOS device (110) (e.g. gate, drain, or source). Each switch (120) can be implemented as any one of an NMOS switching transistor, PMOS switching transistor, a diode, or other active device that can be envisioned by a person skilled in the art. Additionally, an impedance element (130) can be connected between the switch (120) and a reference potential such as ground or the source node of the corresponding device (body-tied-to-source (BTS device)). For example, the impedance element (130) can be an inductor or a primarily inductive element, where inclusion of the inductor would cause the body of the device (110) to float relative to AC (e.g. an RF signal) and connect the body to ground relative to DC. The impedance element (130) can also simply be replaced with a short circuit without detrimentally compromising circuit operation.

If an RF signal (261, 262) is not present at one of the terminals of the NMOS device (110) terminals or an RF signal (261, 262) detected is not of sufficient amplitude (e.g. below a threshold), the detector/control circuit (260) can apply a switch activation signal or otherwise remove application of the switch de-activation signal, closing the switch (120) and thereby connecting the body to ground. This can achieve lower leakage. By way of example, the detector/control circuit (260) can replace the switch de-activation signal with the switch activation signal when an RF signal (261, 262) is not present at one of the NMOS device (110) terminals, closing the switch (120) and thereby connecting the body to the reference potential (e.g. ground).

With reference to FIG. 2A, an RF coupler (280) can be used to detect whether or not an RF signal (261) is present at the gate terminal of the NMOS device (110), although RF couplers can also be coupled to source and/or drain terminals of the NMOS device (110) for detection purposes. With reference to FIG. 2B, an RF signal (262) can also be detected via capacitive coupling (240) coupled to at least one of the NMOS device (110) terminals. The switch (120) can be closed when an RF signal (261, 262) is below a certain threshold, corresponding to no RF signal being detected. In example implementations, closing the switch (120) when no RF signal is detected has been shown to achieve leakage in the range of 1 pA per μm to 1 nA per μm of gate width. The switch (120) can be opened when an RF signal (261, 262) is above a certain threshold, corresponding to an RF signal being detected. In example implementations, opening the switch (120) when an RF signal is detected has been shown to achieve PAE in the range of 40% to 60%.

In some applications, an example threshold for detection can be −75 dBm. With reference back to the RF lineup (190) shown in FIG. 1B, the example threshold value of −75 dBm above would be the smallest amplitude of the primary RF signal (170) that can be generated by the transceiver circuit (182). An example gain of the power amplifier (186) is 15 dB, which leads to an example transmitted signal of −60 dBm at the antenna (188).

Note that embodiments of the present disclosure may be part of an RF lineup similar to that shown in FIG. 1B. The RF lineup can include elements such as a transceiver, a filter, a power amplifier, a duplexer, and an antenna. The RF signal (261, 262) could be detected anywhere in the RF lineup that comprises the device (110) in addition to or instead of RF signals detected at the terminals (e.g. gate, drain, source) of the device (110). In other words, the RF signal (261, 262) can be detected at a transceiver, a filter, a power amplifier, a duplexer, an antenna, or some other element of the RF lineup that comprises the NMOS device (110). By way of example, the RF signal (261, 262) can be in the UHF band, the VHF band, or a different high frequency band and can be a WCDMA or an LTE signal. A person skilled in the art will also be able to identify numerous other frequency bands that the RF signal could occupy and numerous other wireless standards that the RF signal could follow.

Implementations of embodiments of the present disclosure were obtained and operating characteristics, such as leakage and efficiency data, were measured. In one implementation, an NMOS device (110) was constructed with its body connected to ground and performance characteristics measured. After the performance characteristics were obtained from the body tied NMOS device, the connection (body tie) between body and ground of the NMOS device (110) was cut (in particular, by a laser) and performance characteristics measured again.

Figure 3:
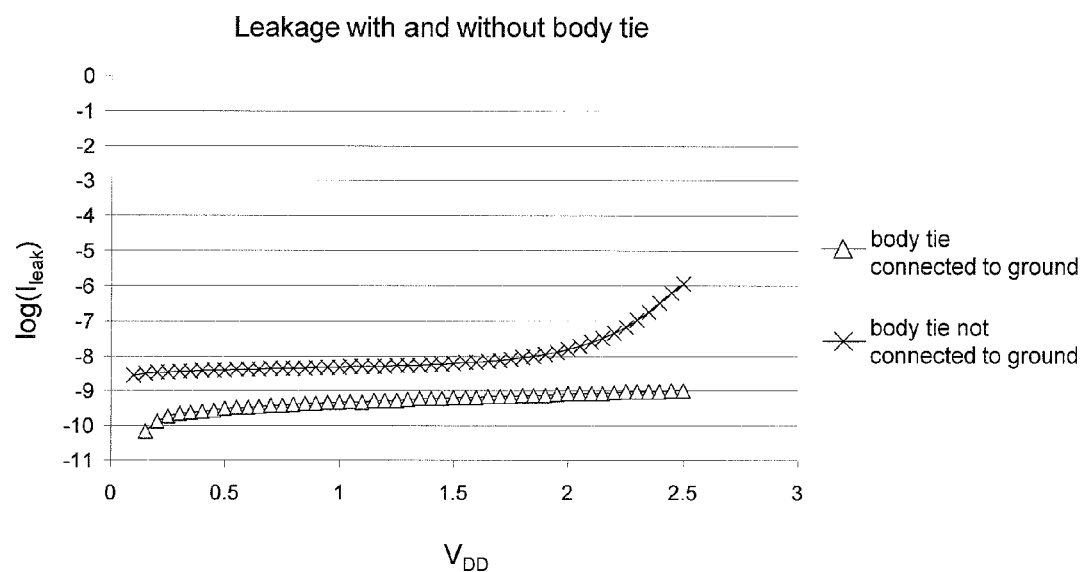
FIG. 3 shows experimental leakage data for a device before and after a connection between device body and ground is cut.

FIG. 3 shows experimental leakage data for a device before and after a connection between device body and ground is cut. In FIG. 3, $I_{leak}$ represents leakage current whereas $V_{DD}$ represents a DC voltage from a battery that is connected to the NMOS device. In this case, leakage refers to a leakage of current from the battery along a current path from drain to source, thereby reducing battery life. Results shown in FIG. 3 indicate that leakage increases after cutting the connection between device body and ground.

Figure 4A:
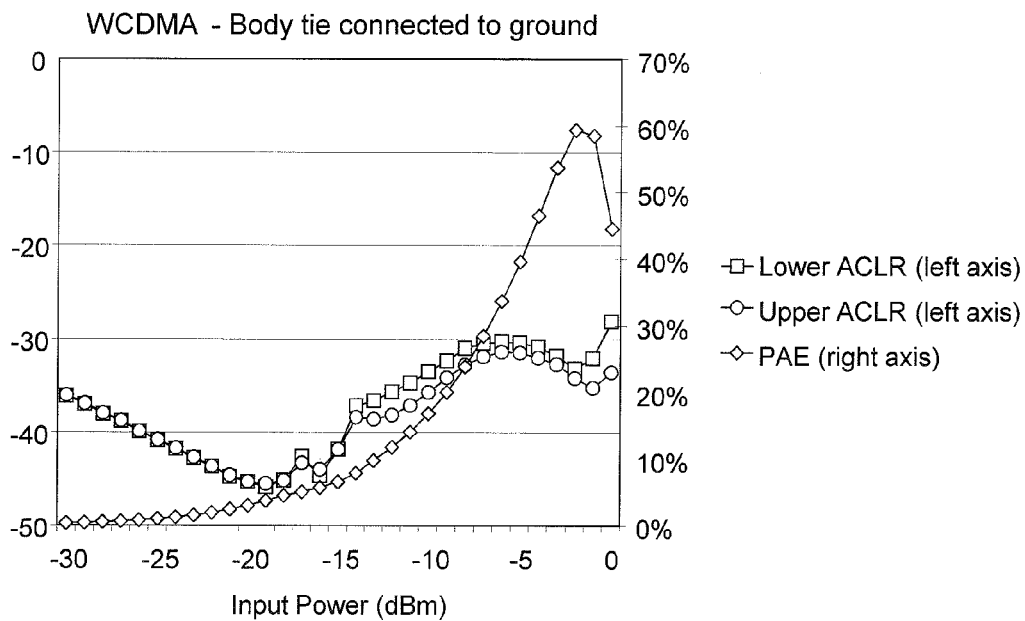
FIGS. 4A and 4B show experimental efficiency and linearity data for a device before and after a connection between device body and ground is cut, respectively.
Figure 4B:
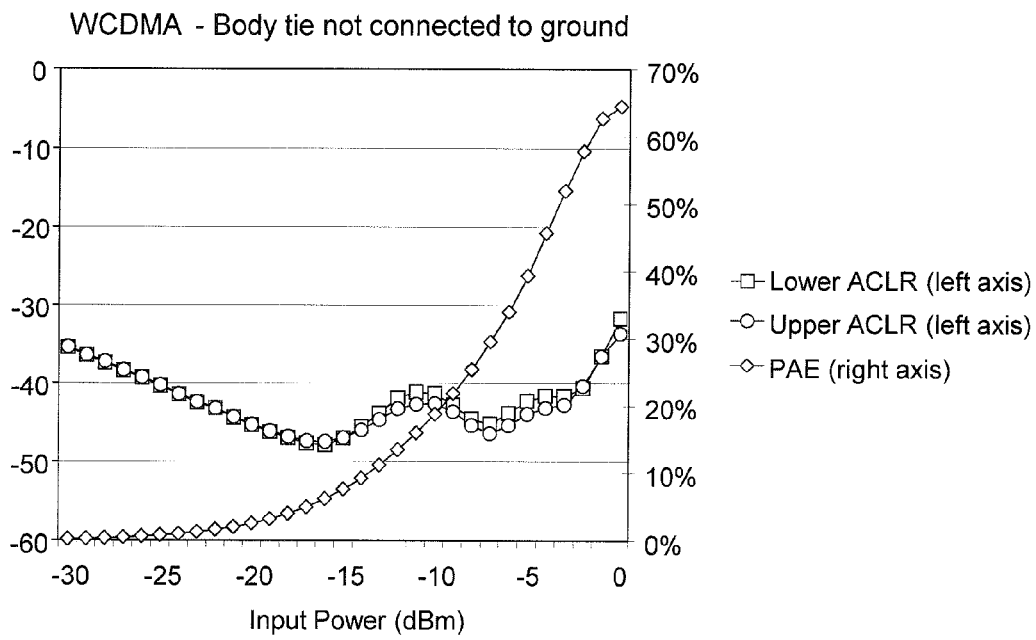

FIGS. 4A and 4B show experimental efficiency and linearity data for a device before and after connection between device body and ground is cut, respectively. In particular, FIGS. 4A and 4B show experimental power added efficiency (PAE) and adjacent channel leakage ratio (ACLR) data. The ACLR data is given with respect to an adjacent channel of frequencies lower than the main channel (denoted as "Lower ACLR") and an adjacent channel of frequencies higher than the main channel (denoted as "Upper ACLR"). Results shown in FIGS. 4A and 4B indicate that PAE improves after cutting the connection between device body and ground. An example ACLR specification is −40 dBc, which generally signifies that the worse of the two ACLR values needs to be −40 dBc or lower. At an ACLR of −40 dBc, the body tied case (FIG. 4A) is at an efficiency of below 10% whereas the floating body case (FIG. 4B) is at an efficiency of around 60%.

It is noted that data shown in FIGS. 4A and 4B may indicate a larger difference in PAE before and after cutting the connection between device body and ground due to design of the device. In particular, body tied performance of the device was compromised by virtue of the device being designed to be cut with a laser. An alternative RF layout can improve body tied performance and decrease PAE differences between the body tied and floating body cases.

As another example, floating body SOS NMOS devices of threshold between 0.4 V to 0.7 V) have been shown to exhibit PAE of 2% to 5% higher than body tied NMOS devices. However, these floating body SOS NMOS devices also tend to exhibit 2 to 6 orders of magnitude worse leakage than body tied NMOS devices.

Embodiments of the present disclosure can combine benefits of both floating body and body tied devices. According to several embodiments of the present disclosure, a semiconductor device is provided that comprises a transistor configured to have its body tied to a reference potential (e.g. ground) node via a switch or its body disconnected from the reference potential node via the switch. The switch can be configured to be controlled by a control signal. In some embodiments, the control signal can provided from other elements in a system comprising the semiconductor device, such as a transceiver circuit or a baseband processor. In other embodiments, the control signal can be derived from an RF signal detected by the semiconductor device. Logic used to open or close the switch can be derived from the control signal.

Provided in the present disclosure are embodiments for a method of operating an amplifier comprising of one or more transistors arranged in a stack, where each transistor has a body. The method can comprise coupling the body of one or more transistors of the stack to a corresponding reference potential (e.g. ground) node when no input signal is provided to the amplifier and decoupling the body from the reference potential (e.g. ground) node when an RF signal is provided to the amplifier. The coupling and decoupling can be carried out using one or more switches, each associated to one transistor of the stack and all controlled via the same control signal. As indicated previously, the presence or absence of a signal is relative to a threshold value that can be set based on application. If a detected signal is above the threshold value (e.g. detected signal is of sufficient amplitude), then the signal is considered to be "present". Similarly, if a detected signal is below the threshold value (e.g.

detected signal is not of sufficient amplitude), then the signal is considered to be "absent" or "not present".

Also provided in the present disclosure are embodiments for a method for fabricating a semiconductor device comprising a plurality of transistors and a plurality of switches, where each transistor has a body. The method can comprise fabricating the transistors and the switches on a substrate, where each switch is adapted to connect the body of the corresponding transistor to a reference potential (e.g. ground) node or disconnect the body of the transistor to the reference potential (e.g. ground) node. The method can further comprise fabricating a control circuit on the substrate, where the control circuit is operable to provide a control signal to the switches.

The examples set forth above are provided to give those of ordinary skill in the art a complete disclosure and description of how to make and use the embodiments of the semiconductor devices with switchable ground-body connection of the present disclosure, and are not intended to limit the scope of what the inventor regard as his disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A semiconductor device, comprising:
    a four terminal transistor that is fabricated on a substrate, the transistor comprising:
        i) a first terminal in contact with a first region of the transistor;
        ii) a second terminal in contact with a second region of the transistor;
        iii) a third terminal configured, during operation of the transistor, to receive a voltage to control a conduction channel in a portion of a body region of the transistor between the first region and the second region; and
        iv) a body terminal in contact with the body region; and
    a switch with a first switch terminal connected to the body terminal and a second switch terminal connected to a reference potential node, a closed condition and an open condition of the switch being controlled by a control signal to provide a first operating characteristic in the transistor by connecting the body terminal to the reference potential node when the switch is closed, and to provide a second operating characteristic in the transistor by disconnecting the body terminal from the reference potential node when the switch is open, wherein:
the switch comprises an inductor operatively connected between the switch and the reference potential node, the inductor configured to cause the body region to float relative to AC and to connect the body region to the reference potential relative to DC,
the first operating characteristic comprises a reduction in a leakage current between the first terminal and the second terminal, and
the second operating characteristic comprises an increase of a power added efficiency (PAE) of the transistor.

2. The semiconductor device according to claim 1, wherein the transistor is a silicon on insulator NMOS transistor or a bulk NMOS transistor.

3. The semiconductor device according to claim 1, wherein in the transistor is configured as one of: a) an amplifier, and b) a power amplifier.

4. The semiconductor device according to claim 1, further comprising:
a control circuit that is configured to generate a switch de-activation signal for disconnecting the body terminal of the transistor from the reference potential node.

5. The semiconductor device according to claim 4, wherein the switch and the control circuit are fabricated on a common substrate.

6. The semiconductor device according to claim 4, further comprising:
a radio frequency (RF) signal detector configured to detect an RF signal in the semiconductor device, wherein the control circuit is configured to receive the detected RF signal and to generate the switch de-activation signal based on the detected RF signal.

7. The semiconductor device according to claim 6, wherein the RF signal is detected in at least one of a source node, a gate node, or a drain node respectively in correspondence of the second terminal, the third terminal and the first terminal of the transistor.

8. The semiconductor device according to claim 7, the control circuit being configured to remove the switch de-activation signal when the RF signal detector fails to detect an RF signal, wherein removal of the switch de-activation signal activates the switch and connects the body terminal of the transistor to the reference potential node.

9. The semiconductor device according to claim 7, the control circuit being configured to replace the switch de-activation signal with a switch activation signal when the RF signal detector fails to detect an RF signal, wherein the switch activation signal is configured to activate the switch and connect the body terminal to the reference potential node.

10. The semiconductor device according to claim 6, wherein:
the RF signal detector comprises an RF coupler configured to split the detected RF signal into at least a first component and a second component,
the transistor is configured to receive the first component and the control circuit is configured to receive the second component, and
the control circuit is configured to generate the switch de-activation signal based on the second component of the detected RF signal.

11. The semiconductor device according to claim 1, wherein the switch comprises an NMOS switching transistor.

12. A semiconductor device, comprising:
a stacked arrangement of transistors that is fabricated on a substrate, each transistor of the stacked arrangement comprising:
i) a first terminal in contact with a first region of the transistor;
ii) a second terminal in contact with a second region of the transistor;
iii) a third terminal, configured, during operation of the transistor, to receive a voltage to control a conduction channel in a portion of a body region of the transistor between the first region and the second region; and
iv) a body terminal in contact with the body region; and
one or more switches in correspondence of one or more transistors from the stacked arrangement of transistors, each with a first switch terminal connected to the body terminal of a corresponding transistor from the one or more transistors, and a second switch terminal connected to a corresponding reference potential node, a closed condition and an open condition of the one or more switches being controlled by a control signal to provide a first operating characteristic in the corresponding transistor by connecting the body terminal of the corresponding transistor to the corresponding reference potential node when a corresponding switch is closed, and to provide a second operating characteristic in the corresponding transistor by disconnecting the body terminal from the reference potential node when the corresponding switch is open,
wherein:
at least one switch of the one or more switches comprises an inductor operatively connected between the at least one switch and the corresponding reference potential node, the inductor configured to cause the body region of the corresponding transistor to float relative to AC and to connect the body region of the corresponding transistor to the reference potential relative to DC,
the first operating characteristic comprises a reduction in a leakage current between the first terminal and the second terminal, and
the second operating characteristic comprises an increase of a power added efficiency (PAE) of the transistor.

13. The semiconductor device according to claim 12, wherein in the stacked arrangement of transistors is configured as one of: a) an amplifier, and b) a power amplifier.

14. The semiconductor device according to claim 12, wherein at least one of the one or more switches comprises an NMOS switching transistor.

15. The semiconductor device according to claim 12, further comprising:
a control circuit that is configured to generate a switch de-activation signal for disconnecting the body terminal of each of the one or more transistors from the corresponding reference potential node.

16. The semiconductor device according to claim 15, further comprising:
a radio frequency (RF) signal detector configured to detect an RF signal in the semiconductor device, wherein the control circuit is configured to receive the detected RF signal and to generate the switch de-activation signal based on the detected RF signal.

17. A method of operating a transistor that is fabricated on a substrate, the transistor comprising a first terminal in contact with a first region of the transistor, a second terminal in contact with a second region of the transistor, a third terminal configured to receive a voltage to control a conduction channel in a portion of a body region of the transistor between the first region and the second region, and a body terminal in contact with the body region, the method comprising:
coupling a body terminal of the transistor to a reference potential node when no input signal is provided to the transistor, thereby reducing a leakage current between a first terminal and the second terminal; and
decoupling the body terminal from the reference potential node when a radio frequency (RF) signal is provided to the transistor, thereby increasing a power added efficiency (PAE) of the transistor.

18. The method according to claim 17, wherein the transistor is a silicon on insulator NMOS transistor or a bulk NMOS transistor.

19. The method according to claim 18, wherein the coupling and decoupling are carried out via a switch.

20. The method according to claim 19, wherein the switch is an NMOS switching transistor.

21. The method according to claim 17, wherein the RF signal encompasses at least one of a UHF or a VHF band of radio frequencies.

22. The method according to claim 17, wherein the RF signal comprises a WCDMA signal or an LTE signal.

23. A method of fabricating a semiconductor device, comprising:
fabricating a transistor on a substrate, the transistor comprising:
i) a first terminal in contact with a first region of the transistor;
ii) a second terminal in contact with a second region of the transistor;
iii) a third terminal configured, during operation of the transistor, to receive a voltage to control a conduction channel in a portion of a body region of the transistor between the first region and the second region; and
iv) a body terminal in contact with the body region; and
fabricating a switch on the substrate with a first switch terminal of the switch connected to the body terminal and a second switch terminal of the switch connected to a reference potential node, and
fabricating a control circuit on the substrate, the control circuit operable to provide a switch de-activation signal for operating the switch to selectively disconnect the body terminal from the reference potential node,
wherein the switch de-activation signal is provided to the switch upon detection of an RF signal in the semiconductor device.

24. The method according to claim 23, wherein the switch de-activation signal is provided to the switch upon detection of the RF signal in at least one of a drain node, a source node, a gate node respectively in correspondence of the first terminal, the second terminal and the third terminal of the transistor.

25. A method of operating a stacked arrangement of transistors, comprising:
coupling a body terminal of one or more transistors from the stacked arrangement of transistors to a corresponding reference potential node when no input signal is provided to an input transistor of the stacked arrangement, thereby providing a corresponding reference potential to the body terminal; and
decoupling the body terminal of the one or more transistors from the corresponding reference node when a radio frequency (RF) signal is provided to the input transistor, thereby floating the body terminal, wherein the one or more transistors comprises the input transistor,
wherein:
the one or more transistors are fabricated on a common substrate, and
each of the one or more transistors comprises:
i) a first terminal in contact with a first region of the transistor;
ii) a second terminal in contact with a second region of the transistor;
iii) a third terminal configured, during operation of the transistor, to receive a voltage to control a conduction channel in a portion of a body region of the transistor between the first region and the second region; and
iv) the body terminal in contact with the body region.

26. The method according to claim 25, wherein one or more transistors from the stacked arrangement of transistors is a silicon on insulator NMOS transistor or a bulk NMOS transistor.

27. The method according to claim 26, wherein the coupling and decoupling are carried out via one or more switches in correspondence of the one or more transistors.

28. The method according to claim 27, wherein a switch from the one or more switches is an NMOS switching transistor.

29. The method according to claim 25, wherein the RF signal encompasses at least one of a UHF or a VHF band of radio frequencies.

30. The method according to claim 25, wherein the RF signal comprises a WCDMA signal or an LTE signal.

31. A method of fabricating a semiconductor device, comprising:
fabricating a stacked arrangement of one or more transistors on a substrate, each of the one or more transistors having a body terminal in contact with a body region of the transistor; and
fabricating one or more switches on the substrate in correspondence of the one or more transistors with a first switch terminal of each of the one or more switches connected to the body terminal of a corresponding transistor and a second switch terminal of each of the one or more switches connected to a corresponding reference potential node;
fabricating a control circuit on the substrate, the control circuit operable to provide a switch de-activation signal for operating the one or more switches in correspondence of the one or more transistors to selectively disconnect the body terminal of each of the one or more transistors from the corresponding reference potential node, the switch de-activation signal being provided to the one or more switches upon detection of an RF signal in the semiconductor device,
wherein each of the one or more transistors comprises:
i) a first terminal in contact with a first region of the transistor;
ii) a second terminal in contact with a second region of the transistor;
iii) a third terminal configured, during operation of the transistor, to receive a voltage to control a conduction channel in a portion of a body region of the transistor between the first region and the second region; and iv) the body terminal in contact with the body region.

32. The method according to claim 31, wherein the switch de-activation signal is provided to the one or more switches upon detection of the RF signal in at least one of a drain node, a source node, a gate node respectively in correspondence of the first terminal, the second terminal, and the third terminal of an input transistor of the stacked arrangement of one or more transistors.

33. A method of fabricating a semiconductor device, comprising:

fabricating a stacked arrangement of one or more transistors on a substrate, each of the one or more transistors having a body terminal in contact with a body region of the transistor; and fabricating one or more switches on the substrate in correspondence of the one or more transistors with a first switch terminal of each of the one or more switches connected to the body terminal of a corresponding transistor and a second switch terminal of each of the one or more switches connected to a corresponding node, wherein:

the corresponding node of the corresponding transistor different from an input transistor of the stacked arrangement is a source node of the corresponding transistor connected to a drain node of an adjacent transistor of the stacked arrangement, the corresponding node of the input transistor is a reference potential node connected to a reference potential, and each of the one or more transistors comprises:

i) a first terminal in contact with a first region of the transistor;

ii) a second terminal in contact with a second region of the transistor;

iii) a third terminal configured, during operation of the transistor, to receive a voltage to control a conduction channel in a portion of a body region of the transistor between the first region and the second region; and iv) the body terminal in contact with the body region.

34. The method according to claim 33, wherein for the corresponding transistor different from the input transistor, the second switch terminal is connected to the corresponding node through a series connected inductor.

35. A semiconductor device, comprising:

a stacked arrangement of transistors that is fabricated on a substrate, each transistor of the stacked arrangement comprising:

i) a first terminal in contact with a first region of the transistor;

ii) a second terminal in contact with a second region of the transistor;

iii) a third terminal, configured, during operation of the transistor, to receive a voltage to control a conduction channel in a portion of a body region of the transistor between the first region and the second region; and iv) a body terminal in contact with the body region; and one or more switches in correspondence of one or more transistors from the stacked arrangement of transistors, each with a first switch terminal connected to the body terminal of a corresponding transistor from the one or more transistors, and a second switch terminal connected to a corresponding node, a closed condition and an open condition of the one or more switches being controlled by a control signal to provide a first operating characteristic in the corresponding transistor by connecting the body terminal of the corresponding transistor to the corresponding node when a corresponding switch is closed, and to provide a second operating characteristic in the corresponding transistor by disconnecting the body terminal from the corresponding node when the corresponding switch is open, wherein:

the corresponding node of the corresponding transistor different from an input transistor of the stacked arrangement is a source node of the corresponding transistor connected to a drain node of an adjacent transistor of the stacked arrangement, the corresponding node of the input transistor is a reference potential node connected to a reference potential, and the first operating characteristic comprises a reduction in a leakage current between the first terminal and the second terminal, and the second operating characteristic comprises an increase of a power added efficiency (PAE) of the transistor.

* * * * *